United States Patent
Pedersen et al.

(10) Patent No.: US 8,227,817 B2
(45) Date of Patent: Jul. 24, 2012

(54) ELEVATED LED

(75) Inventors: Bo Pedersen, Lund (SE); Lars Samuelson, Malmö (SE); Jonas Ohlsson, Malmö (SE); Patrik Svensson, Lund (SE)

(73) Assignee: QuNano AB, Lund (SE)

(*) Notice: Subject to any disclaimer, the term of this patent is extended or adjusted under 35 U.S.C. 154(b) by 86 days.

(21) Appl. No.: 12/520,125

(22) PCT Filed: Dec. 22, 2007

(86) PCT No.: PCT/SE2007/001172
§ 371 (c)(1), (2), (4) Date: Jan. 8, 2010

(87) PCT Pub. No.: WO2008/079078
PCT Pub. Date: Jul. 3, 2008

(65) Prior Publication Data
US 2010/0148149 A1    Jun. 17, 2010

(30) Foreign Application Priority Data

Dec. 22, 2006 (SE) .................................. 0602839
Jan. 12, 2007 (SE) .................................. 0700102
Oct. 26, 2007 (SE) .................................. 0702404

(51) Int. Cl.
*H01L 33/00* (2010.01)

(52) U.S. Cl. ......... 257/94; 257/13; 257/E29.07; 438/22; 977/762

(58) Field of Classification Search ............ 257/12, 257/14, 19, 200, E29.003, E29.07; 438/41, 438/479; 977/816, 893
See application file for complete search history.

(56) References Cited

U.S. PATENT DOCUMENTS

| | | |
|---|---|---|
| 5,196,396 A | 3/1993 | Lieber |
| 5,252,835 A | 10/1993 | Lieber et al. |
| 5,332,910 A | 7/1994 | Haraguchi et al. |
| 5,362,972 A | 11/1994 | Yazawa et al. |
| 5,381,753 A | 1/1995 | Okajima et al. |
| 5,544,617 A | 8/1996 | Terui et al. |
| 5,840,435 A | 11/1998 | Lieber et al. |
| 5,858,862 A | 1/1999 | Westwater et al. |
| 5,897,945 A | 4/1999 | Lieber et al. |
| 5,899,734 A | 5/1999 | Lee |
| 5,976,957 A | 11/1999 | Westwater et al. |
| 5,997,832 A | 12/1999 | Lieber et al. |

(Continued)

FOREIGN PATENT DOCUMENTS

EP    0 443 920    8/1991

(Continued)

OTHER PUBLICATIONS

U.S. Appl. No. 11/922,243, filed Jun. 16, 2006, Wemersson et al.

(Continued)

*Primary Examiner* — William F Kraig
(74) *Attorney, Agent, or Firm* — The Marbury Law Group PLLC

(57) ABSTRACT

The present invention relates to light emitting diodes comprising at least one nanowire. The LED according to the invention is an upstanding nanostructure with the nanowire protruding from a substrate. A bulb with a larger diameter than the nanowire is arranged in connection to the nanowire and at an elevated position with regards to the substrate. A pn-junction is formed by the combination of the bulb and the nanowire resulting in an active region to produce light.

17 Claims, 11 Drawing Sheets

U.S. PATENT DOCUMENTS

| | | | |
|---|---|---|---|
| 6,130,142 | A | 10/2000 | Westwater et al. |
| 6,130,143 | A | 10/2000 | Westwater et al. |
| 6,159,742 | A | 12/2000 | Lieber et al. |
| 6,190,634 | B1 | 2/2001 | Lieber et al. |
| 6,286,226 | B1 | 9/2001 | Jin |
| 6,307,241 | B1 | 10/2001 | Awschalom et al. |
| 6,322,713 | B1 | 11/2001 | Choi et al. |
| 6,328,456 | B1 * | 12/2001 | Mize ................. 362/311.02 |
| 6,340,822 | B1 | 1/2002 | Brown et al. |
| 6,455,340 | B1 | 9/2002 | Chua et al. |
| 6,559,468 | B1 | 5/2003 | Kuekes et al. |
| 6,586,965 | B2 | 7/2003 | Kuekes |
| 6,596,377 | B1 | 7/2003 | Hersee et al. |
| 6,693,021 | B1 | 2/2004 | Motoki et al. |
| 6,709,929 | B2 | 3/2004 | Zhang et al. |
| 6,716,409 | B2 | 4/2004 | Hafner et al. |
| 6,743,408 | B2 | 6/2004 | Lieber et al. |
| 7,014,737 | B2 | 3/2006 | Harutyunyan et al. |
| 7,208,094 | B2 | 4/2007 | Islam et al. |
| 7,223,444 | B2 | 5/2007 | Deppert et al. |
| 7,303,631 | B2 | 12/2007 | Conley, Jr. et al. |
| 7,309,621 | B2 | 12/2007 | Conley, Jr. et al. |
| 7,335,908 | B2 | 2/2008 | Samuelson et al. |
| 7,354,850 | B2 | 4/2008 | Seifert et al. |
| 7,432,522 | B2 | 10/2008 | Samuelson et al. |
| 7,445,742 | B2 | 11/2008 | Chen et al. |
| 7,521,274 | B2 * | 4/2009 | Hersee et al. .............. 438/41 |
| 7,825,032 | B2 * | 11/2010 | Bakkers et al. ............ 438/707 |
| 7,829,443 | B2 * | 11/2010 | Seifert et al. ............... 438/478 |
| 7,928,568 | B2 * | 4/2011 | Sharma et al. ............. 257/750 |
| 2002/0129761 | A1 | 9/2002 | Takami |
| 2002/0130311 | A1 | 9/2002 | Lieber et al. |
| 2002/0172820 | A1 | 11/2002 | Majumdar et al. |
| 2002/0175408 | A1 | 11/2002 | Majumdar et al. |
| 2003/0089899 | A1 | 5/2003 | Lieber et al. |
| 2003/0102444 | A1 | 6/2003 | Deppert et al. |
| 2003/0121764 | A1 | 7/2003 | Yang et al. |
| 2003/0168964 | A1 | 9/2003 | Chen |
| 2003/0200521 | A1 | 10/2003 | DeHon et al. |
| 2004/0075464 | A1 | 4/2004 | Samuelson et al. |
| 2004/0165384 | A1 * | 8/2004 | Allen ........................ 362/267 |
| 2004/0213307 | A1 | 10/2004 | Lieber et al. |
| 2004/0252737 | A1 * | 12/2004 | Yi et al. ...................... 372/43 |
| 2004/0262636 | A1 | 12/2004 | Yang et al. |
| 2005/0006673 | A1 | 1/2005 | Samuelson et al. |
| 2005/0011431 | A1 | 1/2005 | Samuelson et al. |
| 2005/0017171 | A1 | 1/2005 | Samuelson et al. |
| 2005/0161662 | A1 * | 7/2005 | Majumdar et al. ............ 257/18 |
| 2006/0057360 | A1 | 3/2006 | Samuelson |
| 2006/0073680 | A1 | 4/2006 | Han et al. |
| 2006/0097389 | A1 * | 5/2006 | Islam et al. ................. 257/734 |
| 2006/0112466 | A1 | 5/2006 | Den |
| 2006/0125056 | A1 | 6/2006 | Samuelson et al. |
| 2006/0223211 | A1 * | 10/2006 | Mishra et al. ................. 438/41 |
| 2007/0001220 | A1 | 1/2007 | Tombler, Jr. et al. |
| 2007/0172183 | A1 | 7/2007 | Wang |
| 2007/0206488 | A1 | 9/2007 | Thelander et al. |
| 2007/0228583 | A1 | 10/2007 | Islam et al. |
| 2007/0257264 | A1 | 11/2007 | Hersee et al. |
| 2007/0286945 | A1 | 12/2007 | Lahnor et al. |
| 2008/0036038 | A1 | 2/2008 | Hersee et al. |
| 2008/0142926 | A1 | 6/2008 | Seifert et al. |
| 2008/0149914 | A1 | 6/2008 | Samuelson et al. |
| 2008/0149944 | A1 * | 6/2008 | Samuelson et al. ............ 257/88 |
| 2008/0149946 | A1 | 6/2008 | Kim et al. |
| 2009/0014711 | A1 | 1/2009 | Samuelson et al. |
| 2010/0006817 | A1 * | 1/2010 | Ohlsson et al. ................ 257/13 |
| 2010/0025673 | A1 | 2/2010 | Hu et al. |
| 2010/0078055 | A1 * | 4/2010 | Vidu et al. ................... 136/244 |
| 2010/0163840 | A1 * | 7/2010 | Seifert et al. .................. 257/13 |
| 2010/0176459 | A1 * | 7/2010 | Wernersson et al. ........ 257/392 |
| 2010/0283064 | A1 * | 11/2010 | Samuelson et al. ............ 257/88 |
| 2011/0079796 | A1 * | 4/2011 | Wober ............................ 257/82 |
| 2011/0143472 | A1 * | 6/2011 | Seifert et al. ................... 438/45 |
| 2011/0240959 | A1 * | 10/2011 | Konsek et al. ................. 257/13 |
| 2011/0309382 | A1 * | 12/2011 | Lowgren ........................ 257/88 |
| 2011/0315988 | A1 * | 12/2011 | Yu et al. ......................... 257/52 |

FOREIGN PATENT DOCUMENTS

| | | |
|---|---|---|
| EP | 0 838 865 | 4/1998 |
| EP | 1 314 189 | 5/2003 |
| EP | 1 342 075 | 9/2003 |
| EP | 1 369 935 | 12/2003 |
| JP | 2000-068493 | 3/2000 |
| WO | WO 95/02709 | 1/1995 |
| WO | WO 97/31139 | 8/1997 |
| WO | WO 01/03208 | 1/2001 |
| WO | WO 01/77726 | 10/2001 |
| WO | WO 01/84238 | 11/2001 |
| WO | WO 02/01648 | 1/2002 |
| WO | WO 02/080280 | 10/2002 |
| WO | WO 03/005450 | 1/2003 |
| WO | WO 03/053851 | 7/2003 |
| WO | WO 03/063208 | 7/2003 |
| WO | WO 2004/010552 | 1/2004 |
| WO | WO 2004/038767 | 5/2004 |

OTHER PUBLICATIONS

U.S. Appl. No. 11/922,242, filed Jun. 16, 2006, Wemersson et al.
U.S. Appl. No. 11/868,122, filed Oct. 5, 2007, Samuelson et al.
U.S. Appl. No. 11/812,226, filed Jun. 15, 2007, Samuelson et al.
U.S. Appl. No. 11/812,225, filed Jun. 15, 2007, Samuelson et al.
U.S. Appl. No. 10/613,071, filed Jul. 7, 2003, Samuelson et al.
U.S. Appl. No. 11/003,738, filed Dec. 31, 2007, Samuelson et al.
U.S. Appl. No. 12/003,988, filed Jan. 4, 2008, Seifert et al.
U.S. Appl. No. 12/003,741, filed Dec. 31, 2007, Samuelson et al.
U.S. Appl. No. 12/003,740, filed Dec. 31, 2007, Samuelson et al.
U.S. Appl. No. 12/003,739, filed Dec. 31, 2007, Samuelson et al.
U.S. Appl. No. 12/003,738, filed Dec. 31, 2007, Samuelson et al.
U.S. Appl. No. 12/308,249, filed Jan. 14, 2008, Seifert et al.
Yazawa, M. et al., "Heteroepitaxial Ultrafine Wire-Like Growth of InAs on GaAs Substrates", *Applied Physics Letters*, Mar. 11, 1991, pp. 1080-1082, vol. 58, No. 10.
Haraguchi, K. et al., "GaAs p-n junction formed in quantum wire crystals", *Applied Physics Letters*, Feb. 10, 1992, pp. 745-747, vol. 60, No. 6.
Yazawa, M., et al., "Effect of one monolayer of surface gold atoms on the epitaxial growth of InAs nanowhiskers", *Applied Physics Letters*, Oct. 26, 1992, pp. 2051-2053, vol. 61.
Yazawa, M., "Nanocolumns composed of GaAs—InAs jointed whiskers and SiO2 covers", *Applied Physics Letters*, Aug. 29, 1994, pp. 1157-1158, vol. 65.
Sato, T., "Site-controlled growth of nanowhiskers", *Applied Physics Letters*, Jan. 9, 1995, pp. 159-161, vol. 66.
Hiruma, K., et al., "Growth and optical properties of nanometerscale GaAs and InAs whiskers", *Applied Physics Review*, Jan. 15, 1995, pp. 447-462, vol. 77.
Hiruma, K., et al., "Growth and Characterization of Nanometer-Scale GaAs, AiGaAs and GaAs/InAs Wires", *IEICE Trans. Electron.*, Sep. 1, 1994, pp. 1420-1425, vol. E77-C, No. 9.
Hiruma, K., et al., "Gas free-standing quantum-size wires", *Journal of Applied Physics*, Sep. 1, 1993, pp. 3162-3171, vol. 74.
Haraguchi, K., et al., "Polarization dependence of light emitted from GaAs p-n junctions in quantum wire crystals", *Journal of Applied Physics*, Apr. 15, 1994, pp. 4220-4225, vol. 75.
Hiruma, K., et al., Self-organized growth of GaAs/InAs heterostructure nanocylinders by organometallic vapor phase epitaxy, *Journal of Crystal Growth*, Jan. 1, 1996, pp. 226-231, vol. 163.
Lieber, C., "Nanowires as Building Blocks for Nanoscale Science and Technology", *Abstracts of Papers of the Amer. Chem Soc.*, Aug. 18, 2002, pp. 033—Camp Part 1, vol. 224.
Duan, X. et al., "Laser Assisted Catalytic Growth of Single-Crystal Compound Semiconductor Nanowires", *Abstracts of Papers of-the Amer. Chem. Soc.*, Mar. 26, 2000, pp. 676—Inor Part 1, vol. 219.
Duan, X. et al., "Laser Assisted Catalytic Growth of Semiconductor Nanowires for Nanoscale Electronic Optoelectronic Device Application", *Abstracts of Papers of-the Amer. Chem. Soc.*, Apr. 1, 2001, pp. 644—Inor Part 1, vol. 221.

Lieber, C., "Semiconductor Nanowires: Building Blocks for Nanoscale Science and Technology", *Abstracts of Papers of-the Amer. Chem. Soc.*, Aug. 1, 2001, pp. 383—Phys Part 2, vol. 222.

Huang, Y., et al., "Integrated Optoelectronics Assembled from Semiconductor Nanowires", *Abstracts of Papers of-the Amer. Chem. Soc.*, Aug. 18, 2002, pp. 039—Phys Part 2, vol. 224.

Hu, J. et al., "Chemistry and Physics in One Dimension: Synthesis and Properties of Nanowires and Nanotubes", *Acc. Chem. Res.*, Feb. 20, 1999, pp. 435-445, vol. 32, No. 5.

Duan, X. et al., "General Synthesis of Compound Semiconductor Nanowires", *Advanced Materials*, Jan. 1, 2000, pp. 298-302, vol. 12, No. 4.

Duan, X., et al., "Synthesis and optical properties of gallium arsenide nanowires", *Applied Physics Letters*, Feb. 28, 2000, pp. 1116-1118, vol. 76, No. 9.

Cui, Y., et al., "Diameter-controlled synthesis of single-crystal silicon nanowires", *Applied Physics Letters*, Apr. 9, 2001, pp. 2214-2216, vol. 78, No. 15.

Gudiksen, M.S., et al., "Diameter-selective synthesis of semiconductor nanowires", *J. Am. Chem. Soc.*, Aug. 22, 2000, pp. 8801-8802, vol. 122.

Gudiksen, M.S., et al., "Size-Dependent Photoluminescence from Single Indium Phosphide Nanowires", *Journal of Physical Chemistry B*, Mar. 30, 2002, pp. 4036-4039, vol. 106, No. 16.

Duan, X., et al., "Laser-Assisted Catalytic Growth of Single Crystal GaN Nanowires", *Journal of Amer. Chem. Soc.*, Dec. 18, 1999, pp. 188-189, vol. 122, No. 1.

Huang, Y., et al., "Gallium Nitride Nanowire Nanodevices", *Nano Letters*, Jan. 11, 2002, pp. 81-82, vol. 2, No. 2.

Lieber, C., "Nanowire Sugerlattices", *Nano Letters*, Jan. 25, 2002, pp. 82-82, vol. 2, No. 2.

Duan, X., et al., "Nonvolatile Memory and Programmable Logic from Molecule-Gated Nanowires", *Nano Letters*, May 1, 2002, pp. 487-490, vol. 2, No. 5.

Cui, Y., et al., "High Performance Silicon Nanowire Field Effect Transistors", *Nano Letters*, Jan. 1, 2003, pp. 149-152, vol. 3, No. 2.

Zhong, Z., et al., "Synthesis of P-Type Gallium Nitride Nanowires for Electronic and Photonic Nanodevices", *Nano Letters*, Feb. 20, 2003, pp. 343-346, vol. 3, No. 3.

Hu, J., et al., "Controlled Growth and Electrical Properties of Heterojunctions of Carbon Nanotubes and Silicon Nanowires", *Nature*, May 6, 1999, pp. 48-51, vol. 399.

Duan, X., et al., "Indium phosphide nanowires as building blocks for nanoscale electronic and optoelectronic devices", *Nature*, Jan. 4, 2001, pp. 66-69, vol. 409.

Gudiksen, M.S., et al., "Growth of nanawire superlattice structures for nanoscale photonics and electronics", *Nature*, Feb. 7, 2002, pp. 617-620, vol. 415.

Lauhon, L., et al., "Epitaxial Core-Shell and Core-Multishell Nanowire Heterostructures", *Nature*, Nov. 7, 2002, pp. 57-61, vol. 420, No. 6911.

Duan, X., "Single-nanowire electrically driven lasers", *Nature*, Jan. 16, 2003, pp. 241-244, vol. 421.

Lieber, C., "The incredible shrinking circuit", *Sci. Am.*, Sep. 1, 2001, pp. 58-64, vol. 285.

Morales, A., et al., "A Laser Ablation Method for the Synthesis of Crystalline Semiconductor Nanowires", *Science*, Jan. 9, 1998, pp. 208-211, vol. 279.

Cui, Y., et al., "Functional Nanoscale Electronic Devices Assembled Using Silicon Nanowire Building Blocks", *Science*, Feb. 2, 2001, pp. 851-853, vol. 291.

Wang, J., et al., "Highly Polarized Photoluminesence and Photodetection from Single Indium Phosphide Nanowires", *Science*, Aug. 24, 2001, pp. 1455-1457, vol. 293, No. 5534.

Cui, Y., et al., "Nanowire nanosensors for highly sensitive and selective detection of biological and chemical species", *Science*, Aug. 17, 2001, pp. 1289-1292, vol. 293.

Huang, Y., et al., "Logic Gates and Computation from Assembled Nanowire Building Blocks", *Science*, Nov. 9, 2001, pp. 1313-1317, vol. 294.

Cui, Y., et al., "Doping and Electrical Transport in Silicon Nanowires", *The Journal of Physical Chemistry B*, May 11, 2000, pp. 5213-5216, vol. 104, No. 22.

Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.

Morales, A., et al., "Rational Synthesis of Silicon Nanowires", *INOR*, 651, Jan. 1, 2001.

Wong, E., et al., "Nanobeam Mechanics: Elasticity, Strength, and Toughness of Nanorods and Nanotubes", *Science*, Sep. 26, 1997, pp. 1971-1975, vol. 277.

Dai, H., et al., "Synthesis and Characterization of Carbide Nanorods", *Nature*, Jun. 29, 1995, pp. 769-772, vol. 375.

Junno, T., et al., "Controlled manipulation of nanogarticles with an atomic force microscope", *Applied Physics Letters*, Jun. 26, 1995, pp. 3627-3629, vol. 66.

Zwiller, V., et al., "Single quantum dots emit single photons at a time: Antibunching experiment", *Applied Physics Letters*, Apr. 23, 2001, pp. 2476-2478, vol. 78, No. 17.

Borgstrom, M., et al., "High peak-to-valley ratios observed in InAs/InP resonant tunneling quantum dot stacks", *Applied Physics Letters*, May 21, 2001, pp. 3232-3234, vol. 78, No. 21.

Thelander, et al., "Gold manoparticle single-electron transistor with carbon nanotube leads", *Applied Physics Letters*, Sep. 24, 2001, pp. 2106-2108, vol. 79, No. 13.

Ohlsson, B.J., et al., "Size-, shape-, and position-controlled GaAs nono-whiskers", *Applied Physics Letters*, Nov. 12, 2001, pp. 3335-3337, vol. 79, No. 20.

Bjork, M.T., et al., :One-dimensional heterostructures in semiconductor nanowhiskers, *Applied Physics Letters*, Feb. 11, 2002, pp. 1058-1060, vol. 80, No. 6.

Persson, M.P. et al., "Electronic Structure of Nanometer-Scale GaAs Whisker", *Applied Physics Letters*, Aug. 12, 2002, pp. 1309-1311, vol. 81, No. 7.

Thelander, C., et al., "Single-Electron Transistors in Heterostructure Nanowires", *Applied Physics Letters*, Sep. 8, 2003, pp. 2052-2054, vol. 83, No. 10.

Panev, N., et al., "Sharp Exciton Emission From Single InAs Quantum Dots in GaAs Nanowires", *Applied Physics Letters*, Sep. 15, 2003, pp. 2238-2240, vol. 83, No. 11.

Bjork, M.T., "Nanowire resonant tunelling diodes", *Applied Physics Letters*, Dec. 2, 2002, pp. 4458-4460, vol. 81, No. 23.

Persson, A., "Oriented Growth of InAs-based Nanowhiskers", *Diploma Work, Lund Institute of Technology, Lund University*, May 29, 2001, pp. 1-48.

Ohlsson, J., "Semiconductor Hetero- and Nanostructures", *Doctoral Thesis, Lund Institute of Technology, Lund University*, Nov. 23, 2001.

Thelander, C., "Quantum Devices from the Assembly of Zero- and One-Dimensional Building Blocks", *Doctoral Thesis, Lund University*, Nov. 7, 2003.

Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.

Magnusson, M., et al., "Gold nanogarticles: Production, reshaping, and thermal charging", *Journal of Nanoparticle Research*, Jan. 1, 1999, pp. 243-251, vol. 1.

Samuelson, L., "Self-Forming Nanoscale Devices", *Materials Today*, Oct. 22, 2003, pp. 22-31.

Ohlsson, B., et al., "Fabrication and characterization of III-V nanowhiskers", *MSS10 Conference—Austria*, Jul. 23-27, 2001.

Bjork, M.T., et al., "One-dimensional Steeplechase for Electrons Realized", *Nano Letters*, Jan. 19, 2002, pp. 87-89, vol. 2, No. 2.

Martensson, T., et al., "Fabrication of Individually Seeded Nanowire Arrays by Vapour-Liquid-Solid Growth", *Nanotechnology*, Oct. 17, 2003, pp. 1255-1258, No. 14.

Burgess, D.S., "Nanowire Heterostructures Form Tunneling Diodes", *Photonics Spectra*, pp. 3-5, vol. 37, No. 2.

Pettersson, H., et al., "Electrical and Optical Properties of Self-Assembled InAs Quantum Dots in InP Studied by Space-Charge Spectroscopy and Photoluminescence", *Phys. Rev. B*, Feb. 15, 2000, pp. 4795-4800, vol. 61, No. 7.

Ohlsson, B.J., et al., "Growth and characterization of GaAs and InAs nano-whiskers and InAs/GaAs heterostructures", *Physica E*, Mar. 1, 2002, pp. 1126-1130, No. 13.

Samuelson, L., et al., "Tunnel-Induced Photon Emission in Semiconductors Using an STM", *Physica Scripta*, Jan. 1, 1992, pp. 149-152, vol. T42.

Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.

Persson, M., "Tight-Binding Simulation of Nanocrystalline Particles and Whiskers", *Tekn lic thesis, Lund University*, Aug. 1, 2002.

Bjork, M., "Semiconductor Nanowires and Devices", *Tekn lic thesis, Lund University*, Nov. 1, 2002.

Murphy, C.J., et al., "Controlling the Aspect Ratio of Inorganic Nanorods and Nanawires", *Advanced Materials*, Jan. 4, 2002, pp. 80-82, vol. 14, No. 1.

Wagner, R.S., et al., "Vapour-Liquid-Solid Mechanism of Single Crystal Growth", *Applied Physics Letters*, Mar. 1, 1964, pp. 89-90, vol. 4, No. 5.

Canham, L.T., "Silicon Quantum Wire Array Fabrication by Electrochemical and Chemical Dissolution of Wafers", *Applied Physics Letters*, Sep. 3, 1990, pp. 1046-1048, vol. 57.

Koga, T., et al., "Carrier Pocket Engineering Applied to Strained...", *Applied Physics Letters*, Oct. 18, 1999, pp. 2438-2440, vol. 75.

Koga, T., et al., "Experimental Proof-of-Principle Investigation of Enhanced $Z_{3d}T$ in (001) Oriented Si/Ge Superlattices", *Applied Physics Letters*, Sep. 4, 2000, pp. 1490-1492, vol. 77, No. 10.

Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.

Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.

Ferry, D.K., et al., "Transport in Nanostructures", *Cambridge University Press*, Hardcover, Jan. 1, 1997, pp. 41-45 and 91-96.

Givargizov, E., "Growth of Whiskers by the Vapor-Liquid-Solid Mechanism", *Current Tonics in Material Science*, edited by E. Kaldis, Jan. 1, 1978, pp. 79-145, Chapter 3, vol. 1.

Mullins, J., "News analysis: using unusable frequencies", IEEE Spectrum, Jul. 1, 2002, pp. 22-23, vol. 39, No. 7.

Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.

Markowitz, P.D., et al., "Phase Separation in $Al_xGa_{1-x}As$ Nanowhiskers Grown by the Solution-Liquid-Solid Mechanism", *J. Am. Chem. Soc.*, Apr. 18, 2001, pp. 4502-4511, vol. 123.

Hickmott, T.W., et al., "Negative Charge, Barrier Heights, and the Conduction-Ban Discontinuity in $Al_xGa_{1-x}As$ Capacitors", *Journal of Applied Physics*, Apr. 15, 1985, pp. 2844-2853, vol. 57.

Matthews, J., et al., "Defects in Epitaxial Multilayers", *Journal of Crystal Growth*, Jan. 1, 1974, pp. 118-125, vol. 27.

Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.

Sakaki, H., "Scattering Suppression and High-Mobility Effect of Size-Quantized Electrons in Ultrafine Semiconductor Wire Structures", *Japanese Journal of Applied Physics*, Dec. 1, 1980, pp. L735-L738, vol. 19, No. 12.

Scheibel, H., et al., "Generation of Monodisperse Ag- and NaCl Aerosols With Particle Diameters Between 2 and 300 nm", *Journal of Aerosol Science*, Jan. 1, 1983, pp. 113-126, vol. 14, No. 2.

Knutson, E., et al., "Aerosol Classification by Electric Mobility: Apparatus, Theory, and Applications", *Journal of Aerosol Science*, Jan. 1, 1975, pp. 443-451, vol. 6.

Miller, M., et al., "Serpentine Superlattice: Concept and First Results", *Journal of Crystal Growth*, Jan. 1, 1991, pp. 323-327, vol. 111.

Bhat, R., et al., "Patterned Quantum Well Heterostructures Grown by OMCVD on Non-Planar Substrates: Applications to Extremely Narrow SQW Lasers", *Journal of Crystal Growth*, Jan. 1, 1988, pp. 850-856, vol. 93.

Hara, S., et al, "Formation and Photoldnescence Characterization of Quantum Well Wires Using Multiatdc Steps Grown by Metalorganic Vapor Phase Epitaxy", *Journal of Crystal Growth*, Jan. 1, 1994, pp. 692-697, vol. 145.

Givargizov, E.I., "Fundamental Aspects of VLS Growth", *Journal of Crystal Growth*, Jan. 1, 1975, pp. 20-30, vol. 31.

Derycke, V., et al., "Carbon Nonotube Inter- and Intramolecular Logic Gates", *Nano Letters*, Aug. 26, 2001, pp. 453-456, vol. 1, No. 9.

Iijima, S., "Helical microtubules of graphitic carbon", *Nature*, Nov. 7, 1991, pp. 56-58, vol. 354.

Yao, Z., et al., "Carbon Nanotube Intramolecular Junctions", *Nature*, Nov. 18, 1999, pp. 273-276, vol. 402.

Bennett, C., et al., "Quantum information and computation", *Nature*, Mar. 16, 2000, pp. 247-255, vol. 404.

Michler, P. et al., "Quantum correlation among photons from a single quantum dot at room temperature", *Nature*, Aug. 31, 2000, pp. 968-970, vol. 406, No. 6799.

Chow, E., et al., "Three-dimensional control of light in a two-dimensional photonic crystal slab", *Nature*, Oct. 26, 2000, pp. 983-986, vol. 407.

Venkatasubramanian, R., et al., "Thin-Film Thermoelectric Devices with High Room-Temperature Figures of Merit", *Nature*, Oct. 11, 2003, pp. 597-602, vol. 413.

Bachtold, A., et al., "Scanned probe microscopy of electronic transport in carbon nanotubes", *Phys. Rev. Lett.*, Jun. 26, 2000, pp. 6082-6085, vol. 84, No. 26.

Hicks, L.D., et al., "Thermoelectric Figure of Merit of a One-Dimensional Conductor", *Physical Review B*, Jun. 15, 1993, pp. 16631-16634, vol. 47, No. 24.

Itskevich, I.E., et al., "Resonant magnetotunneling through individual self-assembled InAs quantum dots", *Physical Review B*, Dec. 15, 1996, pp. 16401-16404, vol. 54, No. 23.

Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.

Kapon, E., et al., "Stimulated Emission in Semiconductor Quantum Wire Heterostructures", *Physical Review Letters*, Jul. 24, 1989, pp. 430-433, vol. 63, No. 4.

Santori, C., et al., "Triggered Single Photons from a Quantum Dot", *Physical Review Letters*, Feb. 19, 2001, pp. 1502-1505, vol. 86, No. 8.

Capasso, F., et al., "Quantum Cascade Lasers", *Physics Today*, May 1, 2002, pp. 34-40.

Likharev, K.K., "Single-Electron Devices and Their Applications", *Proceedings of the IEEE*, Apr. 1, 1999, pp. 606-632, vol. 87, No. 4.

Han, W., et al., "Synthesis of Gallium Nitride Nanorods Throuah a Carbon Nanotube-Confined Reaction", *Science*, Aug. 29, 1997, pp. 1287-1289, vol. 277.

Zhang, Y., et al., "Heterostructures of Single-Walled Carbon Nanotubes and Carbide Nanorods", *Science*, Sep. 10, 1999, pp. 1719-1722, vol. 285.

Holmes, J., et al., "Control of Thickness and Orientation of Solution-Grown Silicon Nanowires", *Science*, Feb. 25, 2000, pp. 1471-1473, vol. 287.

Zhou, C.W., et al., "Modulated chemical doping of individual carbon nanotubes", *Science*, Nov. 24, 2000, pp. 1552-1555, vol. 290.

Favier, F., et al., "Hydrogen Sensors and Switches from Electrodeposited Palladium Mesowire Arrays", *Science*, Sep. 21, 2001, pp. 2227-2231, vol. 293.

Bachtold, A., et al., "Logic circuits with carbon nanotube transistors", *Science*, Nov. 9, 2001, pp. 1317-1320, vol. 294.

Nicewarner-Pena, S.R., et al., "Submicrometer metallic barcodes", *Science*, Oct. 5, 2001, pp. 137-141, vol. 294.

Service, R.F., "Nanowire Fabricators Earn Their Stripes", *Science*, Jan. 1, 2002, pp. 946-947, vol. 295, No. 5557.

Awschalom, D.D., et al., "Spintronics", *Scientific American*, Jun. 1, 2002, pp. 66-73, vol. 286, No. 6.

Henning, P., et al., "Compositional information from amorphous Si—Ge multilayers using high-resolution electron microscopy imaging and direct digital recording", Ultramicroscopy, Jan. 1, 1996, pp. 221-235, vol. 66.

Wagner, R.S., "VLS Mechanism of Crystal Growth", *Whisker Technology, A.P. Levitt, ed.*, Chapter 3, Jan. 1, 1970, pp. 47-119.

Alferov, Z., et al., "For developing semiconductor heterostructures used in high-speed- and opto-electronics", Nov. 23, 2000, www.nobel.se.physics/laureates/2000/.

Von Klitzing, K., "for the discovery of the quantized Hall effect", Jun. 16, 2000, www.nobel.se/physics/laureates/1985/.

Laughlin, R.B., et al., "For their discovery of a new form of quantum fluid with frictionally charged excitations", Jun. 16, 2000, www.nobel.se/physics/laureates/1998/.

Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.

Hayakawa, K., et al., "AlGaAs Nano-Meter Scale Network Structures Fabricated by Selective Area MOVPE", *Phys. Conf. Ser.*, No. 162, Chapter 8, Oct. 12-16, 1998.

Akabori, M., et al., "Selective Area MOVPE Growth of Two-Dimensional Photonic Crystals Having an Air-Hole Array and its Application to Air-Bridge-Type structure", *Physica E*, No. 13, Jan. 1, 2002, pp. 446-450.

Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.

Kempa, K., et al., "Photonic Crystals Based on Periodic Arrays of Aligned Carbon Nanotubes", *Nano Letters*, Nov. 19, 2002, pp. 13-18, vol. 3, No. 1.

Takahashi, H., et al., "Formation and Characteristics of 100 nm Scale GaAs Quantum Wires by Selective Area MOVPE", *Applied Surface Science*, No. 216, Jan. 1, 2003, pp. 402-406.

Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.

Kamins, T.I., et al., "Self-Assembled Silicon Nanowires for Integrating Microsystems, Nanoelectronics and Microelectronics", *mstnews*, Mar. 1, 2003.

Wu, Y., et al., "Rational Synthesis of Inorganic Nanowires", *Abstracts of Papers in the Amer. Chem. Soc.*, Apr. 1, 2001, pp. 108—Iec Part 1, vol. 221.

Yang, P., et al., "Nanowires from Vapor Condensation and their Assemblies", *Abstracts of Papers in the Amer. Chem. Soc.*, Mar. 26, 2000, pp. 269—Inor Part 1, vol. 219.

Huang, M., et al., "Nanowire Array as Potential 2-d Photonic Bandgap Materials", *Abstracts of Paners in the Amer. Chem. Soc.*, Apr. 1, 2001, pp. 95—Phys Part 2, vol. 221.

Yang, P., et al., "Inorganic Nanowires: Rational Synthesis, Functional Assemblies and Novel Properties", *Abstracts of Papers in the Amer. Chem. Soc.*, Apr. 7, 2002, pp. 343—Inor Part 2, vol. 223.

Gates, B., et al., "Synthesis and Characterization of Crystalline Ag2Se Nanowires through a Template-Engaged Reaction at Room Temperature", *Advanced Fun. Materials*, Oct. 1, 2002, pp. 679-686, vol. 12, No. 10.

Yang, P., et al., "Controlled Growth of ZnO Nanowires and their Optical Properties", *Advanced Functional Materials*, May 2002, pp. 323-331, vol. 12, No. 5.

Wu, Y., et al., "Superconducting MgB2 Nanowires", *Advanced Materials*, Oct. 2, 2001, pp. 1487-1489, vol. 13, No. 19.

Huang, M., et al., "Catalytic Growth of Zinc Oxide Nanowires by Vapor Transport", Advanced Materials, Jan. 16, 2001, pp. 113-116, vol. 13, No. 2.

Wu, Y., et al., "Melting and Welding Semiconductor Nanowires in Nanotubes", *Advanced Materials*, Apr. 4, 2001, pp. 520-523, vol. 13, No. 7.

Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.

Kind, H., et al., "Nanowire Ultraviolet Photodetectors and Optical Switches", *Advanced Materials*, Jan. 16, 2002, pp. 158-160, vol. 14, No. 2.

Xia, Y., et al., "Chemistry and Physics of Nanowires", *Advanced Materials*, Mar. 4, 2003, pp. 351-352, vol. 15, No. 5.

Xia, Y., et al., "One-Dimensional Nanostructures: Synthesis, Characterization, and Applications", *Advanced Materials*, Mar. 4, 2003, pp. 353-389, vol. 15, No. 5.

Yan, H., et al., Morphogesis of One-Dimensional ZnO Nano- and Microcrystalsm, *Advanced Materials*, Mar. 4, 2003, pp. 402-405, vol. 15, No. 5.

Wu, Y., et al., "Germanium/Carbon Core-Sheath Nanostructures", *Applied Physics Letters*, Jul. 3, 2000, pp. 43-45, vol. 77, No. 1.

Wu, Y., et al., "Inorganic Semiconductor Nanowires: Rational Growth, Assembly, and Novel Properties", *Chemistry—A European Journal*, Mar. 15, 2002, pp. 1261-1268, vol. 8, No. 6.

Yang, P., et al., "Langmuir-Blodgett Assembly of One-Dimensional Nanostructures", *Chemphyschem*, Jun. 17, 2002, pp. 503-506, vol. 3, No. 6.

Wu, Y., et al., "Direct Observation of Vapor-Liquid-Solid Nanowire Growth", *J. Am. Chem. Soc.*, Mar. 13, 2001, pp. 3165-3166, vol. 123.

Yan, H., et al., "Dendritic Nanowire Ultraviolet Laser Array", *J. Am. Chem. Soc.*, Mar. 29, 2003, pp. 4728-4729, vol. 125, No. 16.

Johnson, J., et al., "Single Nanowire Lasers", *Journal of Physical Chemistry B*, Oct. 23, 2001, pp. 11387-11390, vol. 105, No. 46.

Messer, B., et al., "Microchannel Networks for Nanowire Patterning", *Journal of the Amer. Chem. Soc.*, Sep. 29, 2000, pp. 10232-10233, vol. 122, No. 41.

Song, J., et al., "MMo$_3$Se$_3$ (M=Li+,Na+, Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Li, Y., et al, "Bismuth Nanotubes: A Rational Low-Temperature Synthetic Route", Journal of the Amer. Chem. Soc., Sep. 14, 2001, pp. 9904-9905, vol. 123, No. 40.

Song, J., et al., "Metal Nanowire Formation Using Mo$_3$Se$_3$-as Reducing and Sacrificing Templates", Journal of the Amer. Chem. Soc., Sep. 26, 2001, pp. 10397-10398, vol. 123, No. 42.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Wu, Y., et al., "Block-by-Block Growth of Single-Crystalline Si/SiGe Superlattice Nanowires", *Nano Letters*, Jan. 19, 2002, pp. 83-86, vol. 2, No. 2.

Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.

Johnson, J., et al., "Single Gallium Nitride Nanowire Lasers", *Nature Materials*, Sep. 15, 2002, pp. 106-110, vol. 1, No. 2.

Huang, M.H., et al., "Room-Temperature Ultraviolet Nanowire Nanolasers", *Science*, Jun. 8, 2001, pp. 1897-1899.

Wu, Y., "Germanium Nanowire Growth via Sample Vapor Transport", *Chem. Mater*, Mar. 20, 2000, pp. 605-607, vol. 12.

Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.

Hiruma, K., et al., "GaAs free-standing quantum-size wires", *Journal of Applied Physics*, Sep. 1, 1993, pp. 3162-3171, vol. 74.

Liu J.L., et al., "Gas-source MBE growth of freestanding Si nanowires on Au/S1 substrate", *Superlattices Microstructures*, 1999, pp. 477-479, vol. 25, No. 1-2.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth", *Superlattices and Microstructures*, Aug. 1998, pp. 157-162, vol. 24, No. 2.

Hiruma, K., et al., "Gas and InAs Nanowire Growth Technology", *Proceedings of the Science and Technology of Atomically Engineered Materials*, Oct. 30, 1995, pp. 563-570.

Westwater, J., et al., "Control of the size and position of silicon nanowires grown via the vapor-liquid-solid technique", *Japanese Journal of Applied Physics*, Part 1, Oct. 1997, pp. 6204-6209, vol. 36.

O'Regan, et al., "A Low-Cost, High-Efficiency Solar Cell Based on Dye-Sensitized Colloidal TiOa Films", *Nature*, Oct. 24, 1991, pp. 737-740, vol. 353.

Jun, et al., "Architectural Control of Magnetic Semiconductor Nanocrystals", *J. Am. Checm Soc.*, Jan. 4, 2002, pp. 615-619, vol. 124, No. 4.

Manna, et al., "Synthesis of Soluble and Processable Rod-, Arrow-, Teardrop-, and Tetrapod-Shaped CdSe Nanocrystals", *J. Am. Chec. Soc.*, Dec. 1, 2000, pp. 12700-12706, vol. 122, No. 51.

Huang, et al., "Directed Assembly of one-dimensional nanostructures into functional networks", *Science*, Jan. 26, 2001, pp. 630-633, vol. 291.

Persson, "Heterointerfaces in III-V semiconductor nanowhiskers", *IEEE*, 2002, pp. 281-283.

Gao, et al., "Self-Assembled Nanowire-Nanoribbon Junction Arrays of ZnO", *The Journal of Physical Chemistry*, Nov. 12, 2002, pp. 12653-12658, vol. 106, No. 49.

Jun, et al., "Controlled Synthesis of Multi-Armed CdS Nanorod Architectures Using Monosurfactant System", *J. Am. Chem. Soc.*, May 5, 2001, pp. 5150-5151, vol. 123.

Poole, et al., "Spatially Controlled, Nanoparticle-Free Growth of InP Nanowires", *Applied Physics Letters*, Sep. 8, 2002, pp. 2055-2057, vol. 83, No. 10.

Hiruma et al., "Quantum Size Microcrystals Grown Using Organametallic Vapor Phase Epitaxy", *Appl. Phys. Lett.*, vol. 59, No. 4, Jul. 22, 1991, pp. 431-433.

Ozaki et al., "Silicon Nanowhiskers Grown on a Hydrogen-Terminated Silicon (111) Surface", *Applied Physics Letters*, vol. 73, No. 25, Dec. 21, 1998, pp. 3700-3702.

Wu et al., "Growth, Branching, and Kinking of Molecular-Beam Epitaxial <110> GaAs, Nanowires", *Applied Physics Letters*, vol. 83, No. 16, Oct. 20, 2003, pp. 3368-3370.

Grätzel, "Photoelectrochemical Cells", *Nature*, vol. 414, Nov. 15, 2001, pp. 338-344.

Wang et al., "Nanocrystals Branch Out", *Nature Materials*, vol. 2, Jun. 2003, pp. 385-386.

Manna et al., "Controlled Growth of Tetrapod-Branched Inorganic Nanocrystals", *Nature Materials*, vol. 2, Jun. 2003, pp. 382-385.

Wang et al., "Rational Growth of Branched and Hyperbranched Nanowire Structures", *Nano Letters*, vol. 4, No. 5, Mar. 31, 2004.

Dick et al., "Synthesis of Branched 'Nanotrees' by Controlling Seeding of Multiple Branching Events", *Nature Materials*, vol. 3, May 2, 2004.

Oda et al., "Natural Formation of Square Scale Structures on Patterned Vicinal Substrates by MOVPE: Application to the Fabrication of Quantum Structures", *Inst. Phys. Conf. Ser.*, No. 166, Chapter 4, Aug. 22, 1999, pp. 191-194.

Akabori et al., "Selective Area MOVPE Growth of Two-Dimensional Photonic Crystals Having an Air-Hole Array and its Application to Air-Bridge-Type Structures", *Physica E*, No. 13, 2002, pp. 446-450.

Melechko et al., "Large-Scale Synthesis of Arrays of High-Aspect-Ratio Ridig Vertically Aligned Carbon Nanofibres", *Nanotechnology*, No. 14, Aug. 19, 2003, pp. 1029-1035.

Wu et al., "Single-Crystal Metallic Nanowires and Metal/Semiconductor Nanowire Heterostructures", *Nature*, vol. 430, Jul. 1, 2004, pp. 61-65.

Zhong et al., "Nanowire Crossbar Arrays as Address Decoders for Integrated Nanosystems", *Science*, vol. 302, Nov. 21, 2003, pp. 1377-1379.

McAlpine et al., "High-Performance Nanowire Electronics and Photonics on Glass and Plastic Substrates", *Nano Letters*, vol. 3, No. 11, Oct. 14, 2003, pp. 1531-1535.

Greytak et al., "Growth and Transport Properties of Complementary Germanium Nanowire Field-Effect Transistors", *Applied Physics Letters*, vol. 84, No. 21, May 24, 2004, pp. 4176-4178.

Whang et al., "Large-Scale Hierarchical Organization of Nanowire Arrays for Integrated Nanosystems", *Nano Letters*, vol. 3, No. 9, Aug. 5, 2003, pp. 1255-1259.

McAlpine et al., "Nanoimprint Lithography for Hybrid Plastic Electronics", *Nano Letters*, vol. 3, No. 4, Mar. 7, 2003, pp. 443-445.

Bozovic et al., "Plastic Deformation in Mechanically Strained Single-Walled Carbon Nanotubes", *Physical Review B*, vol. 57, Jan. 22, 2003, pp. 033407-1-033407-4.

Hahm et al., "Direct Ultrasensitive Electrical Detection of DNA and DNA Sequence Variations Using Nanowire Nanosensors", *Nano Letters*, vol. 4, No. 1, Dec. 9, 2003, pp. 51-54.

Lieber, "Nanoscale Science and Technology: Building a Big Future from Small Things", MRS Bulletin, Jul. 2003, pp. 486-491.

Yu et al., "Silicon Nanowires: Preparation, Device Fabrication, and Transport Properties", *J. Phys. Chem. B.*, vol. 104, No. 50, Nov. 23, 2000, pp. 11864-11870.

Law et al., "Photochemical Sensing of $NO_2$ with $SnO_2$ Nanoribbon Nanosensors at Room Temperature", *Angew. Chem. Int. Ed.*, vol. 41, No. 13, 2002, pp. 2405-2408.

Lao et al., "Hierarchical ZnO Nanostructures", *Nano Letters*, vol. 2, Sep. 13, 2002, pp. 1287-1291.

Barrelet et al., "Synthesis of CdS and ZnS Nanowires Using Single-Source Molecular Precursors", *J. Am. Chem. Soc.*, vol. 125, 2003, pp. 11498-11499.

Björk et al., "Few-Electron Quantum Dots in Nanowires", *Nano Letters*, vol. 4, No. 9, Jul. 28, 2004, pp. 1621-1625.

Martensson et al., "Nanowire Arrays Defined by Nanoimprint Lithography", *Nano Letters*, vol. 4, Mar. 17, 2004, pp. 699-702.

Hornstra, "Dislocations in the Diamond Lattice", *J. Phys. Checm. Solids*, vol. 5, 1958, pp. 129-141.

Krost et al., "InP on Si(111): Accommodation of Lattice Mismatch and Structural Properties", *Appl. Phys. Lett.*, vol. 64, No. 7, Feb. 7, 1994, pp. 769-771.

Gorbach et al., "Growth of III-V Semiconductor Layers on Si Patterned Substrates", *Thin Solid Films*, vol. 336, 1998, pp. 63-68.

Ohlsson et al., "Anti-Domain-Free GaP, Grown in Atomically Flat (001) Si Sub-$\mu$m-sized Openings", *Applied Physics Letters*, vol. 80, No. 24, Jun. 17, 2002, pp. 4546-4548.

Kawanami, "Heteroepitaxial Technologies of III-V on Si", *Solar Energy Materials & Solar Cells*, vol. 66, 2001, pp. 479-486.

Westwater et al., "Growth of Silicon Nanowires Via Gold/Silane Vapor-Liquid-Solid Reaction", *J. Vac. Sci. Technol. B.*, vol. 15, No. 3, 1997, pp. 554-557.

Kamins et al., "Ti-Catalyzed Si Nanowjres by Chemical Vapor Deposition: Microscopy and Growth Mechanisms", *Journal of Applied Physics*, vol. 89, No. 2, Jan. 15, 2001, pp. 1008-1016.

Schubert et al., "Silicon Nanowhiskers Grown on <111> Si Substrates by Molecular-Bean Epitaxy", *Applied Physics Letters*, vol. 84, No. 24, Jun. 14, 2004, pp. 4968-4970.

Kamins et al., "Growth and Structure of Chemically Vapor Deposited Ge Nanowires on Si Substrates", *Nano Letters*, vol. 4, No. 3, Jan. 23, 2004, pp. 503-506.

Thornton et al., "A Photoemission Study of Passivated Silicon Surfaces Produced by Etching in Solutions of HF", *Semicond. Sci. Technol.*, vol. 4, 1989, pp. 847-851.

Borgstrom et al., "Size- and Shape-Controlled GaAs Nano-Whiskers Grown by MOVPE: A Growth Study", *Journal of Crystal Growth*, vol. 260, 2004, pp. 18-22.

Westwater et al., "Si Nanowires Grown Via the Vapour-Liquid-Solid Reaction", *Phys. Stat. Sol.*, vol. (a)165, 1998, pp. 37-42.

Westwater et al., "The Characteristics and Oxidation of Vapor-Liquid-Solid Grown Si Nanowires", *Mat. Res. Soc. Symp. Proc.*, vol. 452, 1997, pp. 237-242.

Westwater et al., "Nanoscale Silicon Whiskers Formed by Silane/Gold Reaction at 335° C.", *Materials Letters*, vol. 24, Jun. 1995, pp. 109-112.

Yang, "Semiconductor Nanowire Array", *Proceedings of the SPIE*, vol. 4806, 2002, pp. 222-224.

Kuykendall et al., "Crystallographic Alignment of High-Density Gallium Nitride Nanowire Arrays", *Nature Materials*, vol. 3, Jul. 25, 2004, pp. 524-528.

Abramson et al., "Fabrication and Characterization of a Nanowire/Polymer-Based Nanocomposite for a Prototype Thermoelectric Device", *Journal of Microelectromechanical Systems*, vol. 13, No. 3, Jun. 2004, pp. 505-513.

Abramson et al., "Nanowire Composite Thermoelectric Devices", *Proceedings of IMECE2002, ASME International Mechanical Engineering Congress & Exposition*, Nov. 17-22, 2002, pp. 7-11.

Johnson et al., "Single Nanowire Waveguides and Lasers", *Proceedings of SPIE*, vol. 5223, 2003, pp. 187-196.

Greene et al., "Low-Temperature Wafer-Scale Production of ZnO Nanowire Arrays", *Angew. Chem. Int. Ed.*, vol. 42, 2003, pp. 3031-3034.

Kim et al., "Nanowire Arrays for Thermoelectric Devices", *Proceedings of HT2003, ASME Summer Heat Transfer Conference*, Jul. 21-23, 2003, pp. 101-104.

Choi et al,. "Self-Organized GaN Quantum Wire UV Lasers", *J. Phys. Chem. B.*, vol. 107, 2003, pp. 8721-8725.

Yang, "From Nanowire Lasers to Quantum Wire Lasers", *Proceedings of SPIE*, vol. 5349, 2004, pp. 18-23.

Mikkelsen et al., "Direct Imaging of the Atomic Structure Inside a Nanowire by Scanning Tunneling Microscopy", *Nature Materials*, vol. 3, Jul. 4, 2004, pp. 519-523.

Thelander et al., "Electron Transport in InAs Nanowires and Heterostructure Nanowire Devices", *Solid State Communications*, vol. 131, Jun. 11, 2004, pp. 573-579.

Samuelson et al., "Semiconductor Nanowires for Novel One-Dimensional Devices", *Physica E*, vol. 21, 2004, pp. 560-567.

Shorubalko et al., "Tunable Nonlinear Current-Voltage Characteristics of Three-Terminal Ballistic Nanojunctions", *Applied Physics Letters*, vol. 83, No. 12, Sep. 22, 2003, pp. 2369-2371.

Samuelson et al., "Fabrication and Spectroscopic Studies of InP/GaInAs/Inp and GaAs/GaInAs/GaAs Quantum-Well Wire Structures", *Inst. Phys. Confer. Ser.* No. 127, Chapter 3, Jan. 1, 1992, pp. 95-98.

Samuelson et al., "Fabrication and Imaging of Quantum Well Wire Structures", *SPIE*, vol. 1676, 1992, pp. 154-160.

Larsson et al., "Probing of Individual Semiconductor Nanowhiskers by TEM-STM", *Microscopy and Microanalysis*, vol. 10, 2004, pp. 41-46.

Ramvall et al., Quantized Conductance in a Heterostructurally Defined $Ga_{0.25}In_{0.75}As/InP$, *Appl. Phys. Lett.*, vol. 71, Aug. 18, 1997, pp. 918-920.

Ng et al., "Growth of Epitaxial Nanowires at the Junctions of Nanowalls", *Science*, vol. 300, May 23, 2003, p. 12.

Ng et al., "Epitaxial Single Crystalline Inorganic Nanowires and Nanowalls: Growth Morphogenesis and Applications in Nano-Optoelectronics", *Proceedings of SPIE*, vol. 5349, 2004, pp. 11-17.

Ng et al., "Three Dimensional Columnar Optical Nanostructures Fabricated by Using Lithography-Free Templating Approach", *Applied Physics Letters*, vol. 84, No. 15, Apr. 12, 2004, pp. 2898-2900.

Thelander et al., "One Dimensional Heterostructures and Resonant Tunneling in III-V Nanowires", *IEEE International Symposium on Compound Semiconductors*, Aug. 25, 2003, pp. 151-152.

Björk et al., "Heterostructures in One-Dimensional Nanowires", *Proceedings of $7^{th}$ International Conference of Nanometer-Scale Science and Technology and $21^{st}$ European Conference on Surface Science*, Jun. 24, 2002.

Ohlsson et al., "Comparison Between (111)B and (100)III-V Nanowhiskers", Proceedings of $7^{th}$ International Conference of Nanometer-Scale Science and Technology and 21st European Conference on Surface Science, Jun. 24, 2002.

Larsson et al, In-Situ Manipulations and Electrical Measurements of III-V Nanowhiskers with TEM-STM, Proceedings of $7^{th}$ International Conference of Nanometer-Scale Science and Technology and $21^{st}$ European Conference on Surface Science, Jun. 24, 2002.

Persson et al., "Solid-phase-diffusion mechanism for GaAs nanowire growth", *Nature Materials*, vol. 3, Oct. 2004, pp. 677-681.

Ng et al., "Single Crystal Nanowire Vertical Surround-Gate-Field-Effect Transistor", *Nano Letters*, vol. 4, No. 7, May 29, 2004, pp. 1247-1252.

Lieber et al., "Nanowires as Building Blocks for Nanoelectronics and Nanophotonics", *Electron Devices Meeting 2003 IEEE International*, 2003, pp. 12.3.1-12.3.3.

Martensson et al., "Epitaxial-III-V Nanowires on Silicon", *Nano Letters*, vol. 4, No. 10, Sep. 23, 2004, pp. 1987-1990.

Jensen et al., "Role of Surface Diffusion in Chemical Beam Epitaxy of InAs Nanowires", *Nano Letters*, vol. 4, No. 10, Sep. 14, 2004, pp. 1961-1964.

Qian et al., "Core/Multishell Nanowire Heterostructures as Multicolor, High-Efficiency Light-Emitting Diodes," NanoLetters, 2005, 5(11):2287-2291.

U.S. Appl. No. 12/224,822, filed Mar. 7, 2007, Samuelson et al.

International Search Report and Written Opinion dated Apr. 25, 2008, in PCT/SE2008/050036, 12 pages.

Bertness et al., "Catalyst-Free Growth of GaN Nanowires," Journal of Electronic Materials, 2006, 35(4):576-580.

Dailey et al., "Vapor-liquid-solid growth of germanium nanostructures on silicon," Journal of Applied Physics, Dec. 15, 2004, 96(12):7556-7567.

Hersee et al., "The Controlled Growth of GaN Nanowires," Nano Letters, 2006, 6(8):1808-1811.

Kipshidze et al., "Controlled growth of GaN nanowires by pulsed metalorganic chemical vapor deposition," Applied Physics Letters, 2005, 86:033104-1 to 033104-3.

Ma et al., "Small-Diameter Silicon Nanowire Surfaces," Science, Mar. 21, 2003, 299:1874-1877.

Mohan et al., "Controlled growth of highly uniform, axial/radial direction-defined, individually addressable InP nanowire arrays," Nanotechnology, 2005, 16:2903-2907.

Mohan et al., "Realization of conductive InAs nanotubes based on lattice-mismatched InP/InAs core-shell nanowires," Applied Physics Letters, 2006, 88:013110-1 to 013110-3.

Pan et al., "Single-crystal growth of metallic nanowires with preferred orientation," Nanotechnology, 2005, 16:1559-1564.

Qian et al., "Core/Multishell Nanowire Heterostructures as Multicolor, High-Efficiency Light-Emitting Diodes," Nano Letters, 2005, 5(11):2287-2291.

\* cited by examiner

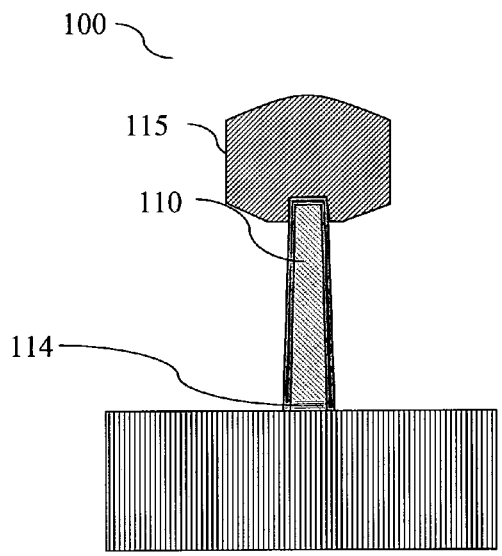 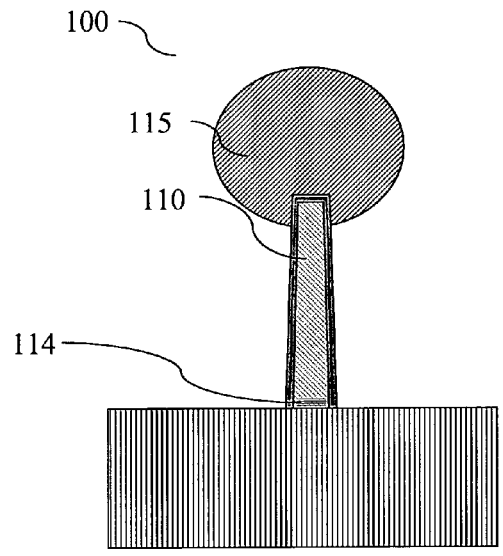
*Fig. 5a*     *Fig. 5b*
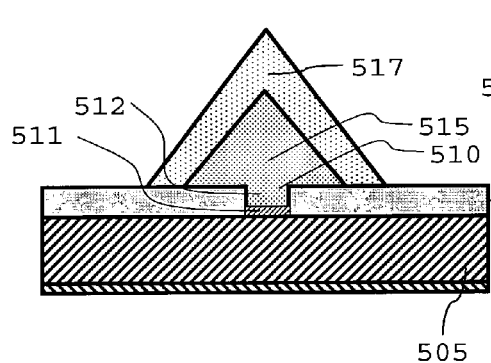 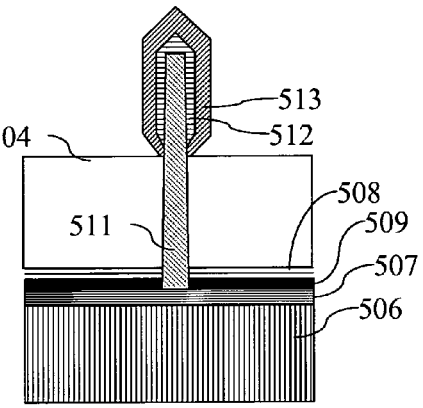
*Fig. 5c*     *Fig. 5d*

(a)　　　　　　　　　　(b)

(a)           (b)

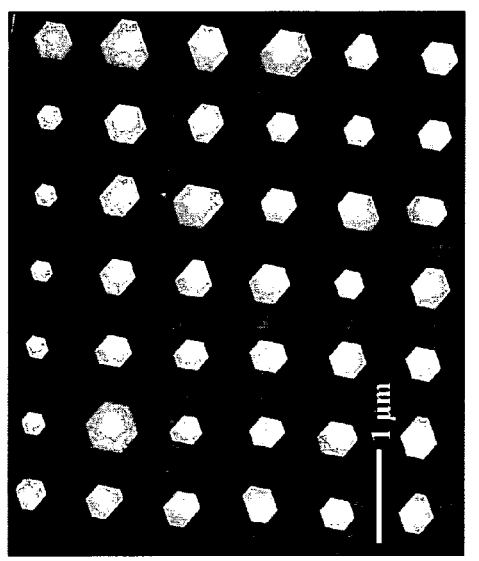 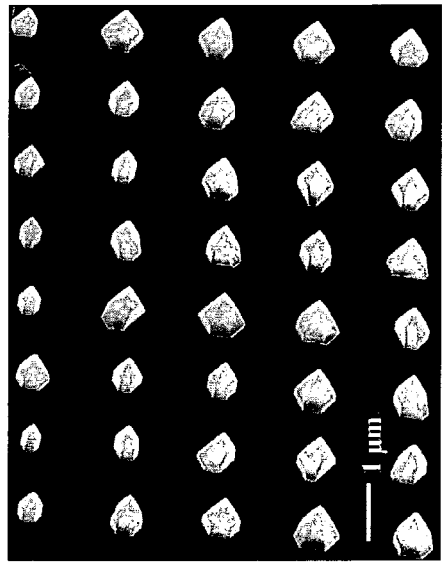
(a)           (b)
Fig. 15
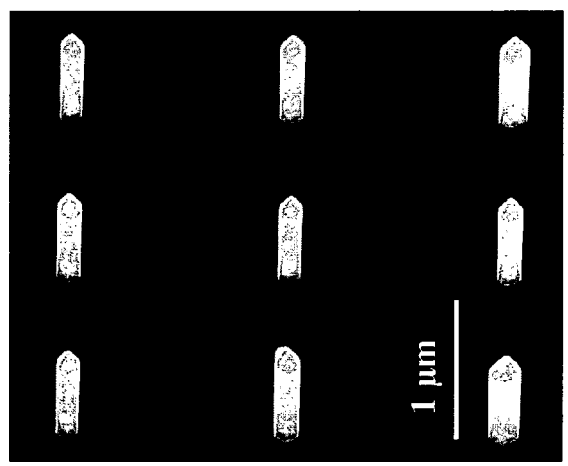
Fig. 16

ELEVATED LED

CROSS-REFERENCE TO RELATED APPLICATIONS

This application is a National Stage application of PCT/SE2007/001172, filed Dec. 22, 2007, which claims priority from Swedish applications SE 0602839-3, filed Dec. 22, 2006, SE 0700102-7, filed Jan. 12, 2007 and SE 0702404-5, filed Oct. 26, 2007.

TECHNICAL FIELD

The present invention relates to light emitting diodes, LEDs. In particular the invention relates to a LED comprising a nanostructure.

BACKGROUND

The today dominating type of light emitting diodes (LEDs) are built on planar technology. The PN junction is constructed as a plurality of layers on a substrate giving a device with an essentially horizontal orientation. The light-producing re-combination takes place in a subset of these layers. As the semiconductor layers have refractive indexes that are substantially higher than the refractive index of the air, a substantial portion of generated light will be reflected in the layers and not contribute to the effective luminescence of the device. In fact the layers will act as a waveguide in the horizontal plane of the LED. Measures have been suggested to mitigate the effects of the light of LED being trapped in the device and to efficiently extract the light out of the semiconductor layers. Such measures include modifying the surface in order to provide portions with varying angles to the horizontal plane. A similar approach is suggested in EP1369935, wherein nanosized particles are provided in the LED device to scatter light or alternatively absorb light and generate light of a different wavelength. In addition the planar technology imposes constrains in terms of miniaturization and choices of suitable materials, which will be further described below.

The development of nanoscale technology and in particular the ability to produce nanowires has opened up possibilities of designing structures and combining materials in ways not possible in planar technology. One basis for this development is that the 1D properties of a nanowire makes it possible to overcome the requirement of lattice matching between different materials in a device made with planar technology. It has been shown and utilized that nanowires of for example InP can be grown on InAs or Si without defects. In US 20040075464 by Samuelson et al a plurality of devices based on nanowire structures are disclosed, for example nanowire LEDs. These LEDs have an internal heterostructure giving quantum confinement effects.

US20030168964 teaches an assembly of a plurality of nanowires acting as LEDs mounted in groups between a conductive transparent substrates at the lower end of the nanowires and a transparent cover substrate at the top end, each individual nanowire having a structure of P-type, N-type and light emitting layer. The nanowires are said to be arranged to emit light through the conductive transparent substrate.

Other nanowire LEDs have been reported previously. Hiruma et al. fabricated vertical GaAs nanowire pn LEDs. The nanowires were embedded in an SOG and covered with an Au/Ge/Ni top contact described in "*GaAs p-n junction formed in quantum crystals*" by Haraguchi et al., Appl. Phys. Lett. 60 (6) 1992. These devices showed room temperature electro luminescence. GaN based nanowire LEDs have also been fabricated as described in "*Core/Multishell Nanowire Heterostructure as Multicolor, High-Efficiency Light-Emitting Diodes*" by Quian et al., Nanoletters.

SUMMARY OF THE INVENTION

Obviously the prior art methods do not fully overcome the inherent limitation of the planar technology, that the light production is confined to an essentially planar grown layer, and that a considerable amount of the produced light will not constructively contribute to the illumination.

The object of the present invention is to provide a nanostructured LED and a method of producing such overcoming the drawbacks of the prior art devices and methods. This is achieved by the device as defined in claim 1.

The LED according to the invention is an upstanding nanostructure with the nanowire protruding from a substrate. A bulb with a larger diameter than the nanowire is arranged in connection to the nanowire and at an elevated position with regards to the substrate. A pn-junction is formed in the nanostructured LED, consisting of a bulb and a nanowire, resulting in an active region to produce light. The bulb is preferably in epitaxial connection with the nanowire.

The bulb has a larger diameter than the nanowire to facilitate doping and to lower the access resistance to the device. However, the bulb is still a comparably small structure and confined in all directions. From an optic perspective the bulb may resemble an ideal point like source. Light produced in the active region will therefore to a high degree leave the structure.

Thanks to the invention an efficient LED device can be provided. The elevation of the light production from the surface facilitate that a larger degree, compared to planar devices, of the produced light will leave the device and contribute to the luminescence.

An advantage with the present invention is that the light production is positioned in an elevated bulb, which bulb can be designed to emit light in an efficient way. The optimal bulb is point-like from an optical perspective, as light is not efficiently confined in ultra-small structures, although this may not be feasible from a perspective including efficient light generation and electronic properties. When the bulb diameter is comparable or larger than the wavelength of the emitted light it may be desirable that a high fraction of the generated light transverse outer surface in direction that is close to normal to the surface. Realistic fabrication constraints and the necessary shielding from the waveguiding properties of the nanowire stem constrain the design of such a structure. The electronic properties can be described as bulk-like in the sense that low resistance and sufficient doping are necessary properties for an efficient LED. Geometries of the bulb include, but is not limited to cylindrical, a hexahedral with a dome-shaped top or spherical.

The use of a nanowire in the nanostrucured LED according to the invention makes it possible to use materials and combinations of materials that otherwise would have been hard, or even impossible due to lattice mismatch. Hence, material combinations can be used that will facilitate the design of LEDs covering the whole visible spectra as well as infrared. In particular the ability to use nitrides such as combinations of GaN, InN, AlN GaAsN, and GaPN to give LEDs in the visible region is of high interest, since these wavelengths are not all accessible by conventional LEDs.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein:

FIG. 5a-d illustrates different embodiments of the LED according to the invention;

FIGS. 15a-b shows SEM images of the sample grown with a NH3 flow rate of 0.5 sccm, and FIG. 16 shows SEM images of the sample grown with a NH3 flow rate of 0.2 sccm.

DETAILED DESCRIPTION

A nanostructured light emitting diode according to the invention comprises an upstanding nanowire as an active element. Suitable methods for growing nanowires on semiconductor substrates are described in US 2003010244. Methods of providing epitaxally grown nanowires with heterostructures are to be found in US 20040075464. Nanowires may also be fabricated by selective growth, wherein in mask is utilized to position the nanowires.

For the purpose of this application an upstanding nanowire should be interpreted as a nanowire protruding from the substrate in some angle, the upstanding nanowire for example epitaxially grown from the substrate. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. For example nanowires and substrates of zinc-blende and diamond semiconductors composed of elements from columns III, V and IV of the periodic table, such nanowires can be grown in the [111] directions and then be grown in the normal direction to any {111} substrate surface. Other directions, given as the angle between normal to the surface and the axial direction of the nanowire, include 70,53° {111}, 54,73° {100}, and 35,27° and 90°, both to {110}. Thus the nanowires define one, or a limited set, of directions.

All references to upper, top, lower, downwards etc are made as considering the substrate being at the bottom and the nanowires extending upwards from the substrate. Vertical refers to a direction parallel to the longer extension of the nanowire, and horizontal to a direction parallel to the plane formed by the substrate. This nomenclature is introduced for the easy of understanding only, and should not be considered as limiting to specific assembly orientation etc.

Figure 1A:
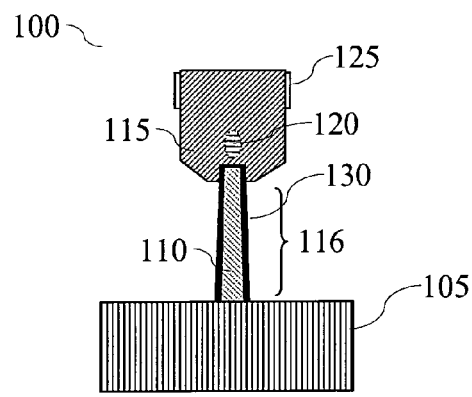
FIG. 1a-b illustrates the LED comprising a nanowire and a bulb according to the present invention.
Figure 1B:
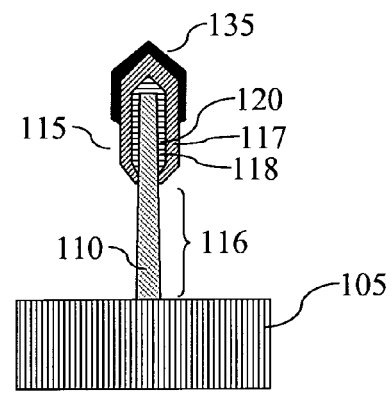

According to the invention the generation of light in a nanostructured LED is elevated from a substrate by the use of a nanowire. A nanostructured LEDs according to the invention are schematically illustrated in FIGS. 1a and 1b and comprises a substrate 105 and a nanowire 110 epitaxially grown from the substrate. The nanowire 110 is essentially cylindrical, for example but not limited to, circular, hexahedral or octahedral. A portion of the nanowire, preferably the top portion, is enclosed by a bulb portion 115. The portion of the nanowire 110 not enclosed by the bulb 115 will be referred to as the neck portion 116. The bulb portion 115 has, at least as regard to doping, bulk like or 3D-like properties, which will be further discussed below. A pn-junction necessary for the diode functionality is formed by combination of the nanowire 110 and the bulb 115. The bulb 115 provides a high degree of doping, and hence the pn-junction can be formed without a direct doping of the nanowire 110, or at least without varying the direct doping of the nanowire 110. This is advantageous since doping of the ID structure can be technologically challenging. A top contact 125 is provided on the bulb 115, for example on top, or in a wrapping configuration on the circumferential outer surface (depicted). The bulb 115 serves the additional purpose as facilitating good contacting properties to the top contact 125, both by providing a larger contacting area as compared to would have been the case if only the nanowire were contacted, and by that the doping of the bulb 115, at least in the region adjacent to the top contact 125, can be adjusted to give matching properties of the bulb 115 and the top contact 125, ensuring good electrical contact. The substrate 105 and part of the upstanding structure may be covered by a cover layer, for example a thin film or as material filling the space surrounding the nanostructured LED. Examples of embeddings of the neck-region include, but are not limited by a low refraction index dielectric or attached to a electrical contact or other conductive layer. Preferably the distance from the substrate to the lower end of the active region is at least in the order of a quarter of the wavelength of the light, or larger, in order to achieve an effective emission of light from the structure.

According to the embodiment depicted in FIG. 1a the nanowire 110 typically has a diameter in the order of 100 nm, and bulb 115 a diameter in the order of 500 nm, i.e a thickness in the order of 200 nm for the part of the bulb 115 enclosing the nanowire. The length of the nanowire 110 is typically and preferably in the order of 0.04-10 µm. The length of the bulb is typically and preferably in the order of 0.4-10 µm. The dimensions of the bulb should be such that the properties as regards to for example receptivity to doping and resistivity are those generally associated and expected from a bulk material. A bulb of for example InGaP:Si with a thicknesses above 150 nm has been shown to show acceptable receptivity to doping. The dimensions, both in actual numbers and that of the parts relative to each other can be varied in order to optimize certain criteria and to accommodate for different combinations of materials. The shape of the bulb 115 should preferably be such that light produced within the bulb should to a large extent be emitted from the bulb and not reflected internally. Such a configuration is the spherical bulb, with a point like light emission centre in the middle. In such a structure the light will always approach the outer surface in a vertical angle.

Such structures are hard to fabricate from semiconductor crystals and sufficient compromises would cylinders, cubicides generally terminated by natural crystal side facets. Also, elongated, or cylindrical bulbs can be of advantage in order to enhance the volume of the active region of the LED. The distance between the active region 120 and the surface of the bulb should in the same order of magnitude in essentially all directions, essentially in this case meaning that the area of the nanowire in the connection to the bulb is neglected.

A cladding layer 130 may be provided on the nanowire 110 for the purpose enhancing optical and electrical properties by decreasing influence from crystal surface and surface states.

The pn-junction results in an active region 120 arranged within the bulb 115, or alternatively in the nanowire 110, but adjacent to the bulb 115. The active region 120 represents the portion of the LED wherein the light is produced. to produce light. It should be noted that the position of the active region 120 in FIG. 1a is a non-limiting example.

According to the embodiment depicted in FIG. 1b the bulb 115 encloses a portion of the upper part of the nanowire 110. The bulb 115 may comprise of one or a plurality of layers 117, 118, forming a shell-like structure, wherein for example one shell provide a p-doped region, one shell, or a plurality of shell accommodates the active region, and another shell is adapted to enhance contacting properties. The bulb 115 typically and preferably covers more than half of the length of the nanowire 110, and has a diameter in the order of 300-800 nm. In a preferred embodiment the bulb 115 provides the p-doped region of the nanostructured LED and the nanowire 110 n-doped. Alternatively the nanowire 110 is intrinsic and the n-doping provided by an n-doped substrate or an n-doped buffer layer between the substrate and the nanowire 110. As appreciated by the skilled person other doping combinations may be formed. The top contact 125, preferably encloses most of the bulb 115, and is preferably of a transparent or semitransparent material. A bottom contact 126 is provided to the base of the nanowire 110, and covers at least a portion of the nanowire that is not enclosed by the bulb 115. Hence, the bottom contact 126 may be L-shaped (as shown) or of a thickness comparable to the portion of the nanowire not enclosed by the bulb. The arrangement according to this embodiment preferably results in an active region 120 that is extended in the bulb in the direction of the nanowire 110, resulting in a cylinder shaped active region, i.e. the active region encloses a portion of the nanowire 110. Depicted is an implementation wherein the top of the nanowire 110 is covered by the bulb 115, and the resulting active region will be a cylinder closed in the top end. Alternatively the bulb 115 may only cover the nanowire 110 in the radial direction and the resulting active region will be an open cylinder.

Figure 2A:
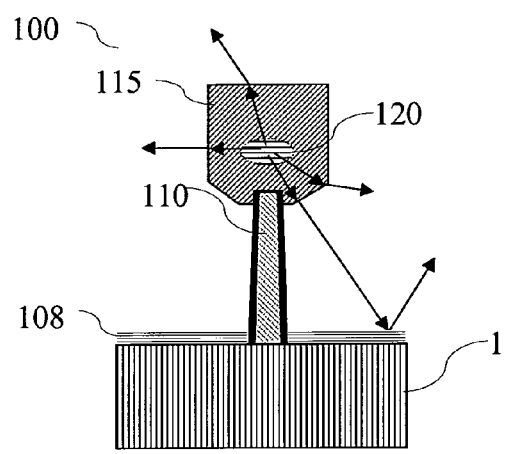
FIG. 2a-b illustrates how light is emitted from the LED according to the present invention.
Figure 2B:
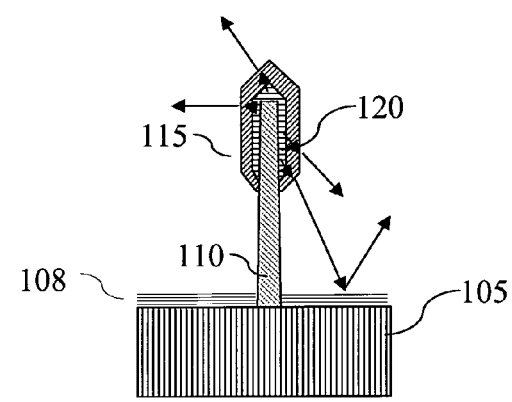

Schematically indicated in FIG. 2a-b are the advantages of elevating the light production from the substrate plane. Due to the geometry a large portion of the produced light will hit a surface of the bulb at an angle above the critical angle, and hence that light will not be reflected internally. According to embodiments of the invention the active region 120 extends radially outwards of the nanowire 110. The different embodiments of the invention are characterised by that the emission of the upper half of the nanostructured LEDs are significantly higher than from the lower half.

According to one embodiment of the invention a reflective layer 108 is provided on the substrate 105, or alternatively on the cover layer, if such is utilised. The purpose of the reflective layer is to reflect light that is emitted from the nanostructured LED in downward directions. The reflective layer 108 is preferably provided in the form of a multilayered structure comprising repeated layers of AlGaAs/GaAs or GaN/AlGaN for example, or as a metal film. Preferably the reflective layer 108 extends a distance from the outer periphery of the bulb 115 in the radial direction towards the center of the bulb/nanowowire, or alternatively described, extends under the bulb 115 seen from the side view of FIGS. 2a-b. Even more preferably, the reflective layer 108 extends under a portion of the active region 120 so that the reflective layer overlaps with the active region (120), facilitating reflection of light leaving the bulb 115 with angles close to the vertical direction.

FIG. 2b corresponds to the embodiment introduced with reference to FIG. 1b, wherein the active region is primarily positioned radially outwards of the nanowire 110 and the reflective layer 108 extends under the active region. An advantageous reflecting condition will be achieved, and represents an embodiment of the invention, if at least a portion of the active region extends out from the nanowire in the radial direction, a reflecting layer is provided that extends under the bulb, and a neck portion 116, which is at least 10 nm. Even more preferably the neck portion should be at least 30 nm.

Figure 3:
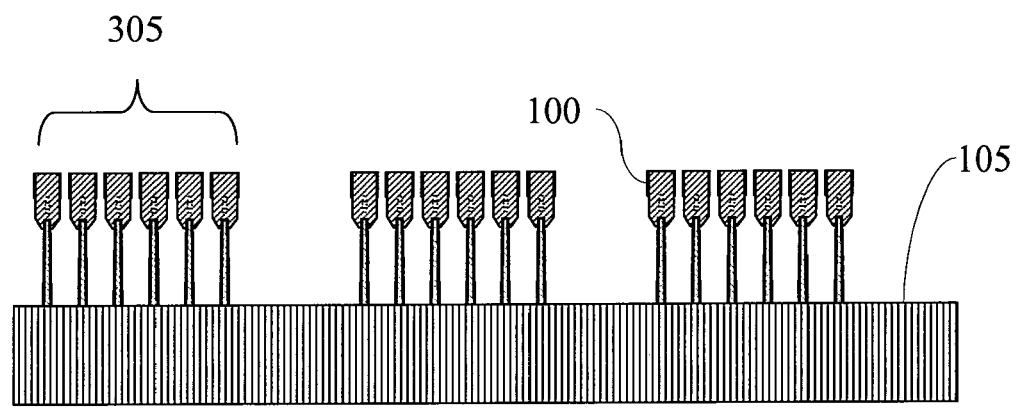
FIG. 3 illustrates a device according to the present invention comprising a plurality of groups of LEDs.

In a device utilising the nanostructured LED according to the invention, for example a device for illuminating purposes, typically a plurality of nanostructured LEDs are provided on one substrate, as illustrated in FIG. 3. The nanostructured LEDs may be organised in groups, wherein each group 305 is group-wise addressable. The reflective layer 108 is in the case of a plurality of nanostructured LEDs preferably provided on as much of the substrate area in between the nanostructured LEDs as possible, at least within each group 305.

A portion of the produced light will enter the nanowire 110 and hence, to a large degree not contribute to the illuminance produced by the device. The ability to growth nanowires with well defined diameters, as described in the above cited references and exemplified below, is in one embodiment of the invention utilised to minimize the amount of light entering the nanowire 110, and thereby not contributing to the illuminance. In the embodiment the diameter of the nanowire 110 is chosen so as to not favour transmission of the light in the nanowire itself. A wavelength, or wavelength region will correspond to a characteristic diameter of the nanowire. A rule of thumb would be that diameter must be smaller than $\lambda/2n_w$, wherein $\lambda$ is the wavelength of the produced light and $n_w$ is the refractive index of the nanowire 110. However, for the electrical properties of the nanowire, it may be advantageous to have a comparably large diameter. A diameter smaller than 80 nm will lead to some degree of reflective properties for wavelengths in the visible spectra, and still sufficient electrical properties for most applications.

Figure 4C:
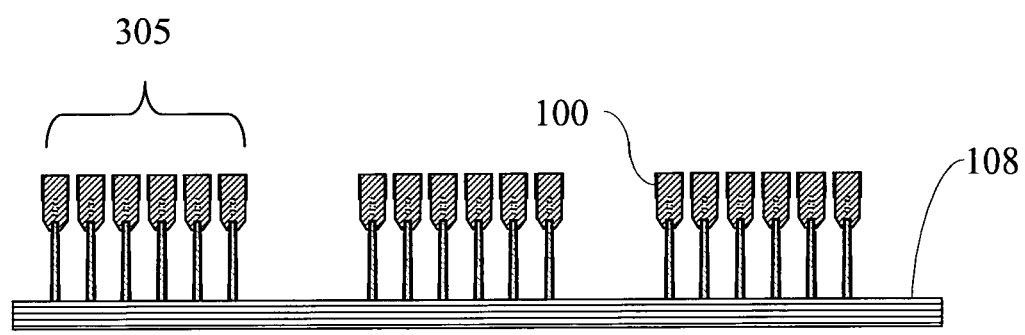
FIG. 4a-c illustrates different embodiments of the LED according to the invention.
Figure 4A:
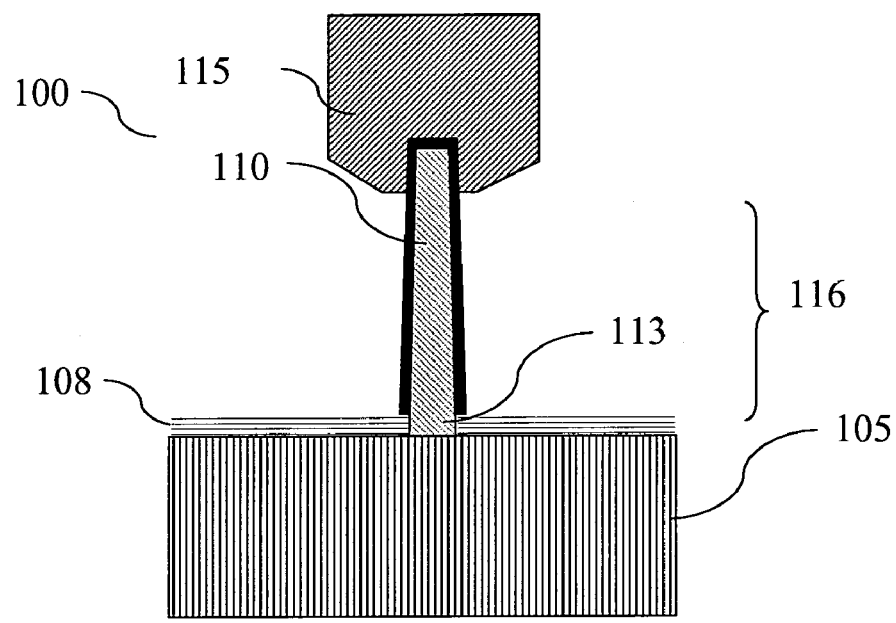
Figure 4B:
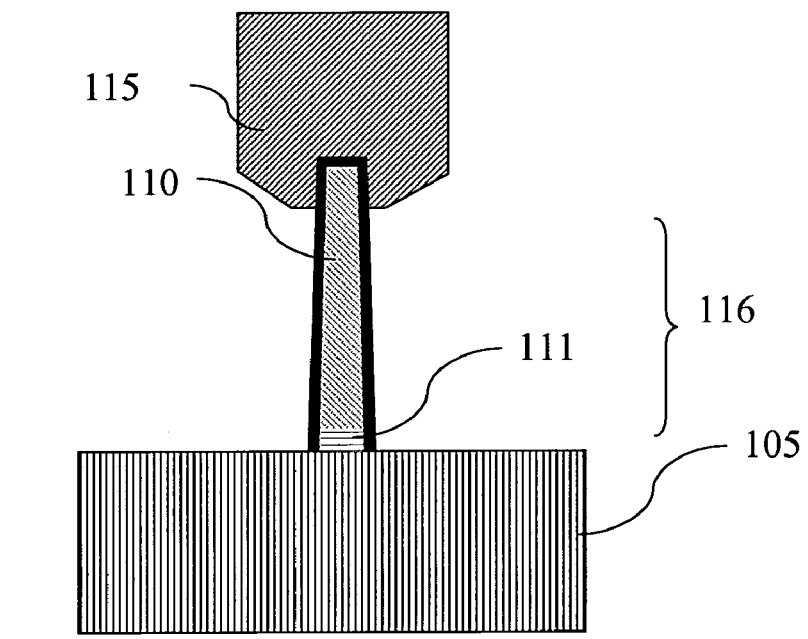

An alternative approach to reduce losses in the nanowire is to provide reflection in the lower end of the nanowire is to arrange the reflective layer 108 to continue under a portion of the nanowire 110, or under a part of the nanowire/cladding combination as illustrated in FIG. 4a. It can also be positioned in the substrate, under the nanowire (not shown). Alternatively a reflective layer can be provided under the substrate 105. The reflective layers is preferably provided in the form of a multilayered structure comprising repeated layers of AlGaS/GaAs or GaN/AlGaN for example, or as a metal film. A stem 113 adjacent to the substrate is formed, the stem 113 having a smaller diameter than the nanowire/cladding above. A method of producing such will be described below. If the diameter of stem 113 is sufficiently smaller than the wavelength of the light a large fraction of the directed light mode will extend outside the waveguide, enabling efficient reflection by the reflective layer 108 layer surrounding the narrow part of the waveguide. Yet another alternative is to introduce reflective means 111 within the nanowire, as illustrated in FIG. 4b. Such reflective means can be a multilayered structure provided during the growth process of the nanowire, the multilayered structure comprising repeated layers of for example $SiN_x/SiO_x$ (dielectric) or GaAs/AlGaAs (semiconductor). A further alternative is to, during manufacturing of the device, provide a reflective layer between the substrate and the nanowire, and in a following manufacturing step remove the substrate, giving the design schematically illustrated in FIG. 4c, wherein the nanostructured LEDs are provided directly on the reflective layer 108. Alternatively a buffer layer (not shown) of for example GaN, is provided between the reflective layer 108 and the nanostructured LEDs.

The shape of the bulb 115 should preferably be such that light produced within the bulb should to a large extent be emitted from the bulb and not reflected internally. By elevating the part of the LED that produces light from the substrate and arranging the active region 120 in a bulb that is confined in all directions, i.e. the distance from the active region 120 to more than one outer surface of the bulb 115 is in the order of a few 100 nm or less, light can be emitted in almost all directions. The light emitting parts are placed displaced from the substrate surface towards the desired hemisphere of light emission, as that the substrate surface plane can act as a mirror plane, reflecting the light rather than transponding. Preferably the bulb 115 has surfaces facing the substrate or alternatively described: a fictive plane perpendicular to the direction of the nanowire 110. This should be compared to prior art LEDs based on planar technology, wherein light is emitted only from a surface parallel to the substrate. The bulb can from an optical perspective be described as point-like, whereas from an electronic perspective have bulk properties. The optimal geometry of a bulb is a sphere, but the implementation will be a compromise of that can be achieved with existing in future production methods. The previous depicted cylindrical bulb, which is achievable with the referred methods of growing nanowires, is a sufficiently good approximation of a sphere. Other geometries of the bulb 115, illustrated in FIG. 5a-c that are plausible include, but is not limited to a cylindrical bulb with a dome-shaped top (a) a spherical/ellipsoidal (b), and pyramidal (c). The pyramid structure of FIG. 5c, may comprise of a substrate 505 of a first material and a first portion 511 of the nanowire 510 of a second material, or of the same material as in the substrate. A second portion 512 of the nanowire 510 and the bulb 515 comprises of a third material, i.e. the transfer of materials are within the nanowire 510. The bulb 515 may be covered by a further layer 517. As an exemplary implementation an undoped InGaN nanowire is grown on a $n^+$ GaN/Sapphire substrate 110 through a silicon nitride mask 517 allowing for a $p^+$ GaN volume element 515 on top The pyramidal shape should be seen as exemplary, also other shapes, as hexahedral or cylindrical could be used with this general structure. An exemplary embodiment comprising a shell-like structure of the bulb 515 is schematically illustrated in FIG. 5d. A nanostructured LEDs 501 is provided on a Si (111) substrate 506 covered by a n-GaN buffer layer 507. The nanostructured LEDs comprises of a nanowire 511, forming a n-GaN core, covered by one or more InGaN well layers 512, which in turn is covered by a p-GaN shell layer 513. A growth mask 509, for example of $Si_3N_4$, is provided over the buffer layer 507 and extends adjacent to the nanowires/n-GaN cores/ neck regions. In addition a reflector layer 508 may be provided also extending beneath the bulb 515 in the same manner as the growth mask 509. Optionally a spacer layer is 504 is provided beneath the bulb 515 with the purpose of elevating the bulb 515 and hence the active region to predetermined distance above the substrate. The active region is in this example formed in the radial overgrowth, and hence the favourable reflecting conditions discussed with reference to FIG. 1b may be achieved.

Figure 6:
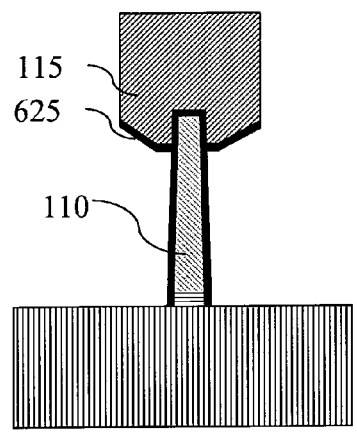
FIG. 6 illustrates an embodiment of the LED according to the invention.

In an embodiment illustrated in FIG. 6 the top contact 625 is provided only on the parts of the volume element facing the substrate 105. Preferably a resistive material is arranged between the top contact 625 and the nanowire 110. The top contact 125 is made of a reflective material, for example a metal, thereby serving both as a contact and as a reflector for light initially directed towards the substrate.

To form the pn-junction necessary for light production at least part of the nanostructure need to be doped. As indicated above the volume element is provided partly to solve general difficulties associated with doping of nanoelements, and to facilitate good electrical contacting properties. It is important to decrease access resistances in order to increase device efficiency. The nanowire in itself is not optimal from this perspective as the elongated nature and low area of the nanowire cross-section will build device resistance. The main tools of fabricating low resistance contacts, a task complicated by the intrinsically low contact-surfaces given by the nanowire geometry, are high doping and low band gap adjustment on the semiconductor side of the contact, but as mentioned, the doping of nanoelements is challenged by several factors. However, certain other parts of a nanowire device are not in need of high doping, or, their doping-level is of less priority and can be balanced against other design parameters. There are also devices where doping of critical parts will decrease device performance. Such examples of contra-productive doping effects are non-emitting impurity levels in an optical region or impurity scattering, decreasing mobility, in a field effect channel.

The volume element 115 according to the invention extends in three dimensions, has a large volume and a large surface, whereby the challenging doping procedures for nanoelements may be avoided, the processing is simplified and more reliable, the access resistance may be decreased, both due to doping and to an increased contact surface, the advantages of using a nanowire as an active component in an LED may fully utilized.

The volume element/nanowire architecture enhances both electrical and optical performance of a LED. The volume element 115 works as a carrier reservoir enabling high carrier injection into the nanowire from a region with well defined doping where low resistance contacts easily can be fabricated, preferably in a wrap around configuration in order to increase contact area and minimize distance between the nanowire and the contact. The low internal resistance and the increased amount of carriers vouch for a high injection of majority carriers into the nanowire already at low forward voltages. High injection of carriers into the nanowire 110 introduces high concentrations of electron hole pairs into the nanowire increasing light emitting recombination. The high concentration of electron-hole pairs, in combination with the active region being extended into a waveguide, directing the light, can enable stimulated emission, increasing the output of the device further.

By using different material compositions in the nanowire 110 and the volume element 115, the nanowire material composition can be chosen to propagate into the volume element 115 in order to decrease the optical disturbance by the connection with the nanowire. Extending the length of the nanowire in the direction of the emitted light will increase re-absorption. To decrease re-absorption the composition of the nanowire is adjusted in the direction of the emitted light in order to raise the band gap as compared to the energy of the emitted light.

Figure 13:
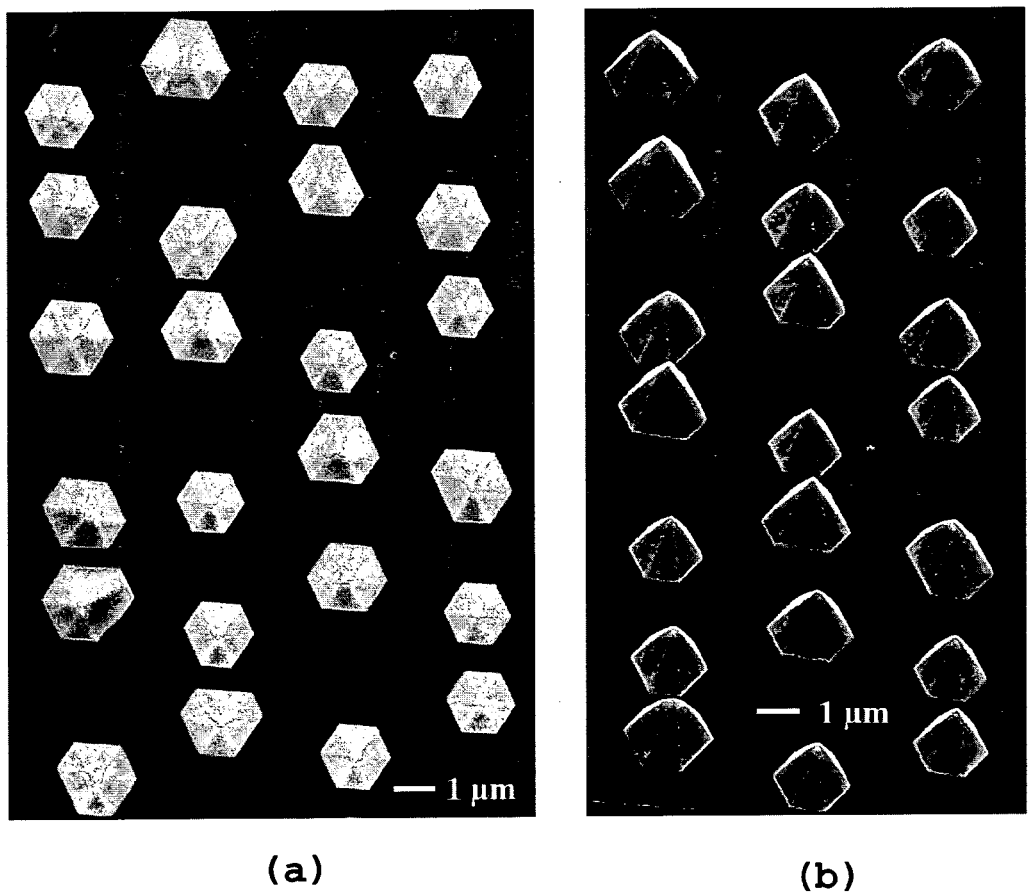
FIGS. 13a-b shows SEM images of the sample grown with a $NH_3$ flow rate of 3.0 sccm.

A method of fabricating nanostructured LED is to first grow a nanowire, according to the above referred processes. Part of the nanowire is then masked and the volume element is re-grown selectively. The method is illustrated in FIG. 13. The volume element grows both axially and radially, hence, when the nanowire is masked partly, the nanowire becomes enclosed in the volume element. Appropriate masking materials are e.g. silicon nitride, silicon oxide etc.

One method of fabricating nanostructured LED is to grow a nanowire selectively from a hole in a mask layer. With subsequent radial growth the thickness of the mask layer will define the length of the neck 116, i.e. the portion of the nanowire 110 not covered by the bulb 115. The mask may later be etched away or kept in the final device. Alternatively a spacer lay is provided on the mask layer, whereby the combination of the mask layer and the spacer layer will define the length of the neck 116.

Considering systems where nanowire growth is locally enhanced by a substance, as VLS grown nanowires, the ability to alter between radial and axial growth by altering growth conditions enables the procedure (nanowire growth, mask formation, and subsequent selective growth) can be repeated to form nanowire/3D-sequences of higher order. For systems where nanowire growth and selective growth are not distinguished by separate growth conditions it may be better to first grow the nanowire along the length and by different selective growth steps grow different types of 3D regions or volume elements.

Figure 7:
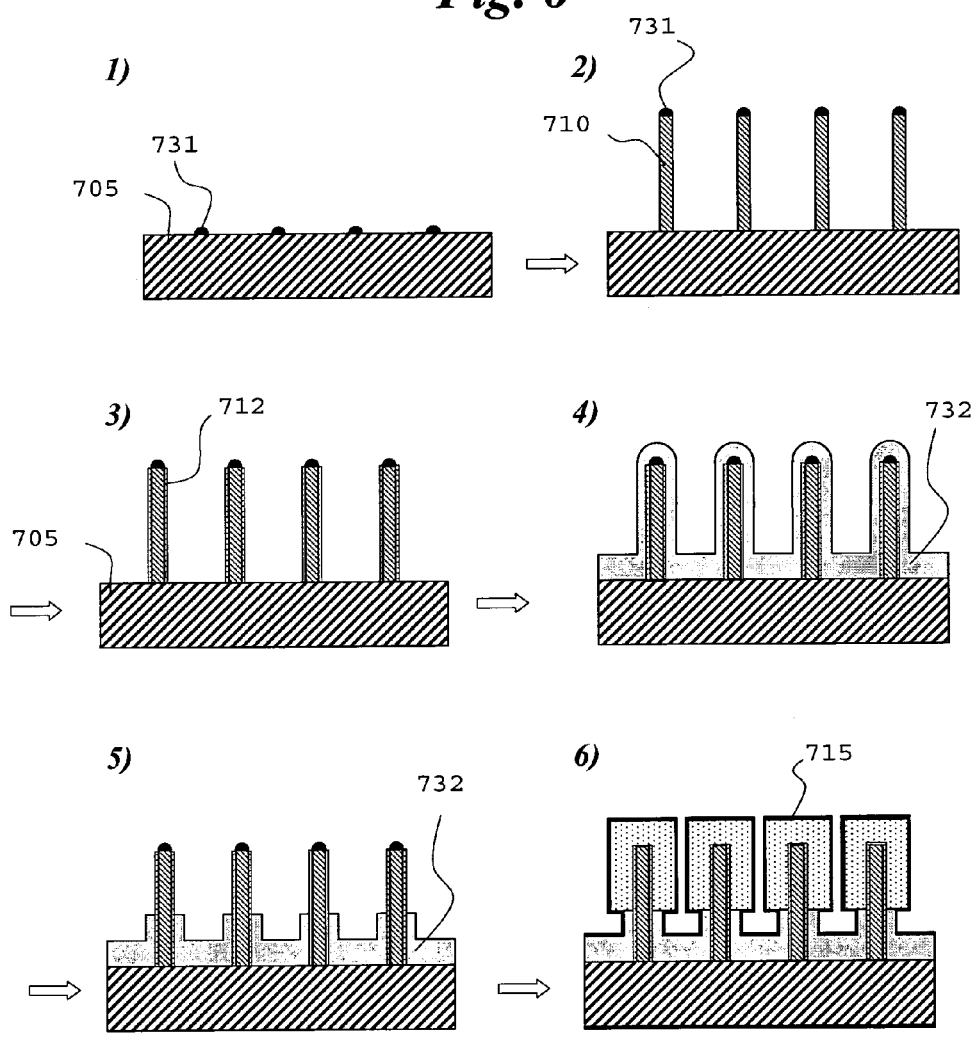
FIG. 7 illustrates steps in the production method according to the invention.

A method according to the present invention is exemplified with the fabrication of a light emitting pn-diode/array with active nanowire region(s) formed of GaAs and InGaP, illustrated in FIG. 7. The method comprises the steps of:
1. Defining of local catalyst/catalysts on a p+ GaP substrate 705 by lithography.
2. Growing GaAs nanowire 1310 from local catalyst 731. The growth parameters adjusted for catalytic wire growth.
3. Radial growing of thin InGaP concentric layer 712 around the nanowire (cladding layer).
4. Depositing of $SiO_2$ as mask material 732,
5. Back etching of mask 732 to open up the upper parts of the nanowires
6. Selective growing of n+ InGaP volume element 715. The growth parameters adjusted to give radial growth.
7. (not shown) Forming contacts 1325 on the volume element and to the substrate.

The growth process can be varied in known ways to for example include heterostructures in the nanowires, provide reflective layers etc. The stem 113 utilised in some embodiment can be provided by first growing a thin nanowire (step 2), depositing a reflective layer or a selective growth mask covering the lower part, and radial growing of cladding layer or the nanowire to increase the nanowire thickness.

Depending on the intended use of the nanostructured LED, availability of suitable production processes, costs for materials etc, a wide range of materials can be used for the different parts of the structure. In addition the nanowire based technology allows for defect free combinations of materials that otherwise would be impossible to combine. The III-V semiconductors are of particular interest due to their properties facilitating high speed and low power electronics. Suitable materials for the substrate include, but is not limited to: Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe, CdTe. Suitable materials for the nanowire 110 and the volume element 115 include, but is not limited to: GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and AlN, which gives facilitates fabrication of LEDs emitting light in wavelength regions not easily accessible by conventional technique. Other combinations of particular commercial interest include, but is not limited to GaAs,GaInP, GaAlInP, GaP systems. Typical doping levels range from $10^{18}$ to $10^{20}$. A person skilled in the art is though familiar with these and other materials and realizes that other materials and material combinations are possible.

The appropriateness of low resistivity contact materials are dependent on the material to be deposited on, but metal, metal alloys as well as non-metal compounds like Al, Al—Si, $TiSi_2$, TiN, W, $MoSi_2$, PtSi, $CoSi_2$, $WSi_2$, In, AuGa, AuSb, AuGe, PdGe, Ti/Pt/Au, Ti/Al/Ti/Au, Pd/Au, ITO (InSnO), etc. and combinations of e.g. metal and ITO can be used.

Examples of realizations of the nanostructured LED according to the present invention will be given as GaAs nanowires epitaxially grown on GaP and Si substrates. The LED functionality has been established on both kinds of substrates. The structures are evaluated in terms of temperature-dependent photoluminescence, electroluminescence, and radiation pattern.

A LED device according to the realisation comprises arrays of III-V light emitting nanowire diodes, grown and integrated on Si. Each device is built around a GaAs nanowire core, directly grown on either GaP or Si. A portion of each diode acts as the active region in these individual nanosized p-i-n light emitting structures.

Figure 8:
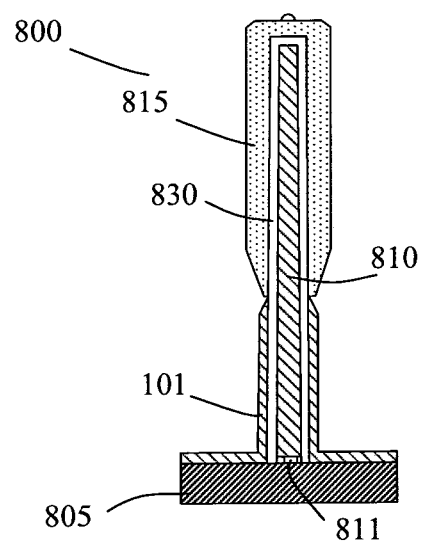
FIG. 8 schematically illustrate a LED nanostructure according to the present invention.

The LED device 801, shown in FIG. 8, comprises of p-i-n diode structures 800. The substrate 805 is an integral part of the device, as it functions as a common p-layer. Each nanostructured LED 800 structure comprise a nanowire 810, a cladding 830 enclosing at least a portion of the nanowire, a cap or bulb 815 and a top contact. The sequence of p-doped, n-doped and intrinsic semiconductor materials will depend on the substrate material. On GaP the structure is: p-GaP (substrate) 805, i-GaP 811/i-GaAs (nanowire) 810, i-InGaP (cladding) 830, n-InGaP (bulb) 815. On Si the structure is: p-Si(substrate) 805, i-GaP/i-GaAs (nanowire) 810, i-InGaP (cladding) 830/n-InGaP (bulb) 815. The i-GaP 811 (nanowire) layer in the nanowire base is approximately 60 nm thick in both the devices and serves the dual purposes of a nucleation segment for improved growth quality and electron barrier.

Figure 9A:
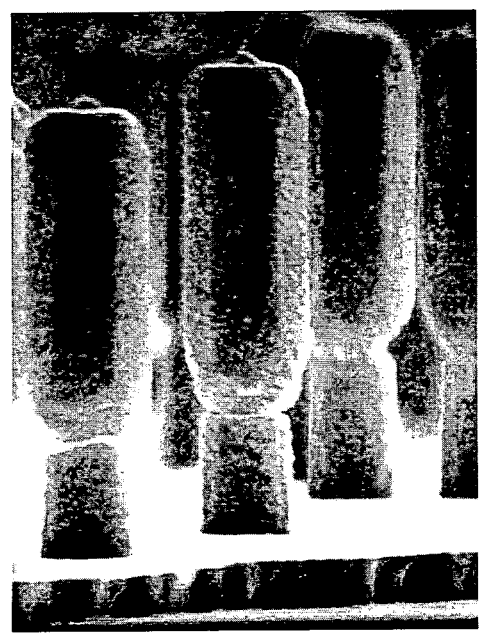
FIG. 9a is a SEM-image of a nanostructure LED according to FIGS. 8, and 9b is an image of an active LED nanostructure.
Figure 9B:
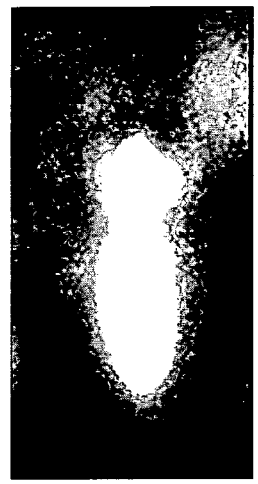

The fabrication process is outlined in the following. THMa metal organic sources and TMIn together with $AsH_3$, $PH_3$, and $Si_2H_6$ as precursor gases were used. Two growth steps were employed. First, 2 μm long GaAs/GaP nanowires were grown on p-type GaP (111)B (p=~$10^{18}$ $cm^{-3}$) and Si (111) (p=$10^{15}$ $cm^{-3}$) substrates by particle assisted growth using randomly deposited, 60 nm diameter nm sized Au aerosols with a particle density of 1/$μm^2$. The nanowires were enclosed with 40 nm thick radial InGaP cladding layer, nominally lattice matched to GaAs. After this step, samples were unloaded for photoluminescence characterization or subsequent fabrication of the nano LEDs. 80 nm thick $SiO_2$ was deposited onto the samples lined for LED fabrication. The SiO$_2$ was back etched back to only cover the substrate surface and up to approximately 1 μm of the side wall of the nanowire. The samples were then reloaded into the MOVPE reactor and a radial Si-doped InGaP layer was selectively grown on the upper part of the GaAs/InGaP core structure. The LEDs were fully covered with 150-300 nm thick 200×200 μm$^2$ quadratic Ni/Ge/Au contacts, each covering approximately 40000 individual nanostructured LEDs. The p-contact was fabricated on the backside of the substrate with conductive Ag paste. Other means of contacting, for example using transparent contacts are known in the art and easily adopted to the present method and device. A scanning electron microscopy (SEM) image of the structure is shown in FIG. 9a.

One important difference between the Si and the GaP device is the heterostructure sequence in the base of the nanowire, on GaP substrate being p-GaP (substrate)/i-GaP (nanowire)/i-GaAs (nanowire), while on Si substrate being p-Si (substrate)/i-GaP (nanowire)/i-GaAs (nanowire), and both hole injection conditions and internal resistance and should be expected to be appreciably different between the two structures.

Figure 10:
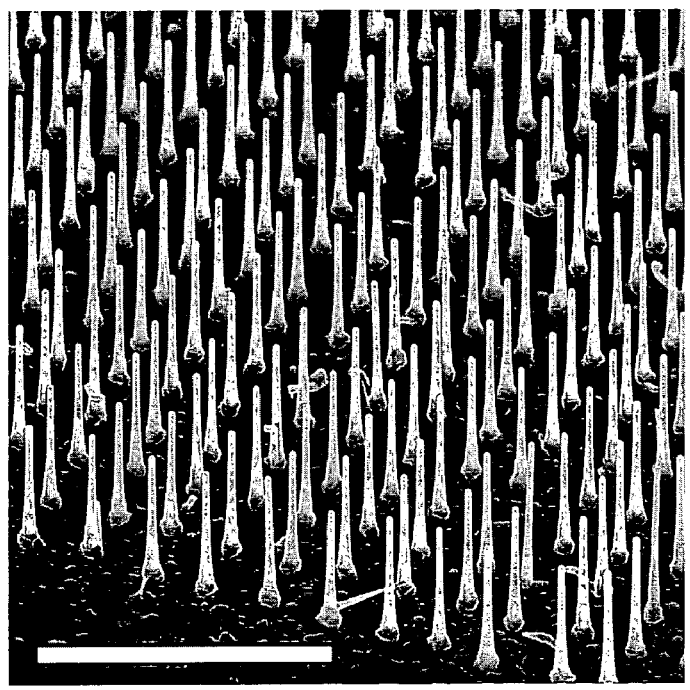
FIG. 10 is a SEM image of nanowire structures of the invention after the first MOVPE step.

FIG. 10 depicts nanowire structures after the first MOVPE step. Depicted are GaAs nanowires with a thin InGaP cladding layer, a GaP nucleation segment in the base of the nanowires, and with the Au based seed particle still attached to the top. Such structures were also transferred to neutral substrates for PL characterization. As shown in FIG. 10 the yield is essentially 100 percent on both GaP and Si substrates. The fabrication of the nanostructured LEDs on Si is refined to the degree that the nanowires are uniformly aligned the (111) direction normal to the substrates and essentially no nanowires are grown in the three declined (111) directions that also extends out from the substrate. This in contrast to prior art methods of III-V nanowire growth on Si(111). The well aligned growth of III-V nanowires in predefined array structures on Si substrates, as seen in FIG. 10, is a prerequisite for successful large scale fabrication of optical devices, as well as most other applications.

LED functionality can be indicated by Photoluminescence (PL) measurements. The measurements here presented were carried out at room temperature and at a temperature of 10 K. The result is illustrate in the graphs of FIGS. 11a-c and FIG. 9b. A laser emitting at 473 nm was used as an excitation source. The PL was collected by an optical microscope, dispersed through a spectrometer and detected by a liquid N$_2$ cooled CCD camera.

Figure 11:
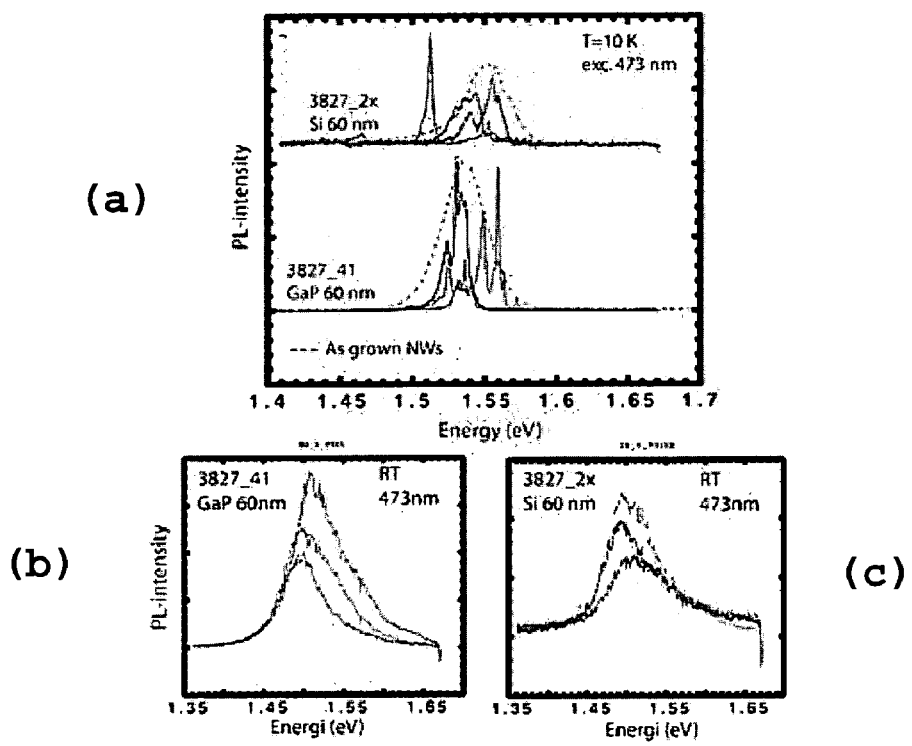
FIGS. 11a-c are photoluminescence graphs of nanowires and LED nanostructure according to FIGS. 8a-b and FIG. 10.

To study the PL from the nanowires without influence of the substrate, the nanowires were broken off and transferred from the substrate where they were grown, and then deposited on a patterned Au surface. In this way the nanowires could also be studied individually. The PL spectra, as shown in FIG. 11a, acquired at 10 K from the as-grown nanowires were similar for nanowires grown from a Si substrate and the nanowires grown from a Si substrate (Si) and the nanowires grown from a GaP substrate (GaP). The dashed lines are the spectra from (a large number of) nanowires still standing on the substrate. The spectra from individual nanowires showed larger differences, with the nanowires grown from a GaP substrate being more structured. The average PL intensity for the nanowires grown from Si was about a factor of 20 lower than for the corresponding nanowires grown from GaP. This is in fair agreement with the 10-30 times lower electro-luminence seen for the Si-LED as compared to the GaP-LED. At room temperature the spectra are broad and featureless and there is very little spectral difference between nanowires from the two samples.

Both the LED on GaP and on Si demonstrated electroluminescence (EL) when applying a forward bias, as shown in FIGS. Ta-b. The spectral peak of the light is in fair agreement with the GaAs bandgap energy.

Figure 12:
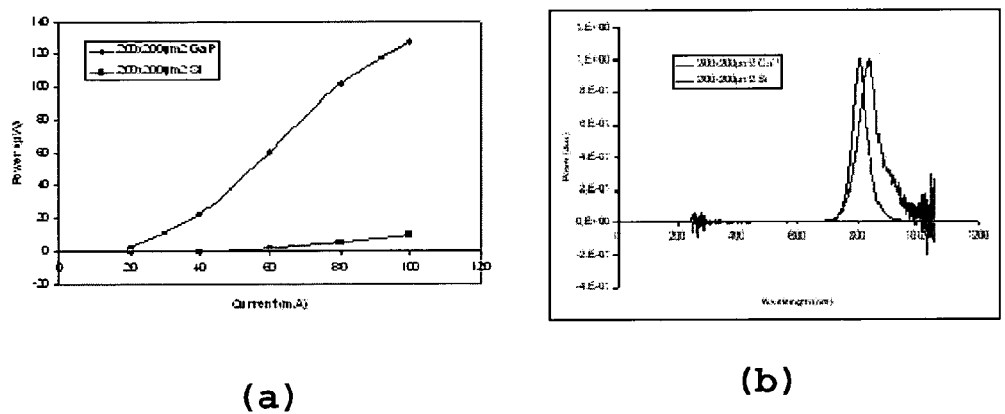
FIG. 12 shows a) Power dependence of Electroluminescence of GaAs LEDs grown on GaP and Si, b) EL spectra at 80 mA from GaP and Si based LED nanostructures.

As seen in FIG. 12a and b the light power/current dependence is shown for the Si based (Si) and GaP based (GaP) LEDs. The LED on GaP lights up at half the current load (20 mA) of the Si (40 mA) and at 60 mA the power output is approximately 30 times higher on the GaP substrate. However, at 100 mA the power ratio has decreased to 10 times the Si based LED. The EL spectral peak is shown for 80 mA load for both devices. The Si LED peak show a slight red shift and tail with a possible extra peak around 1.35 eV as compared to the GaP substrate device. The shift in peaks can be explained by the different In and Ga diffusion on GaP and Si leading to different InGaP composition. By pushing the devices, going to higher currents a peak power can be seen for approximately 140 mA for the GaP device. This is not seen with the Si device and may be an indication that non-radiative recombination or competing leakage mechanisms still dominate the EL at these current levels.

Figure 14:
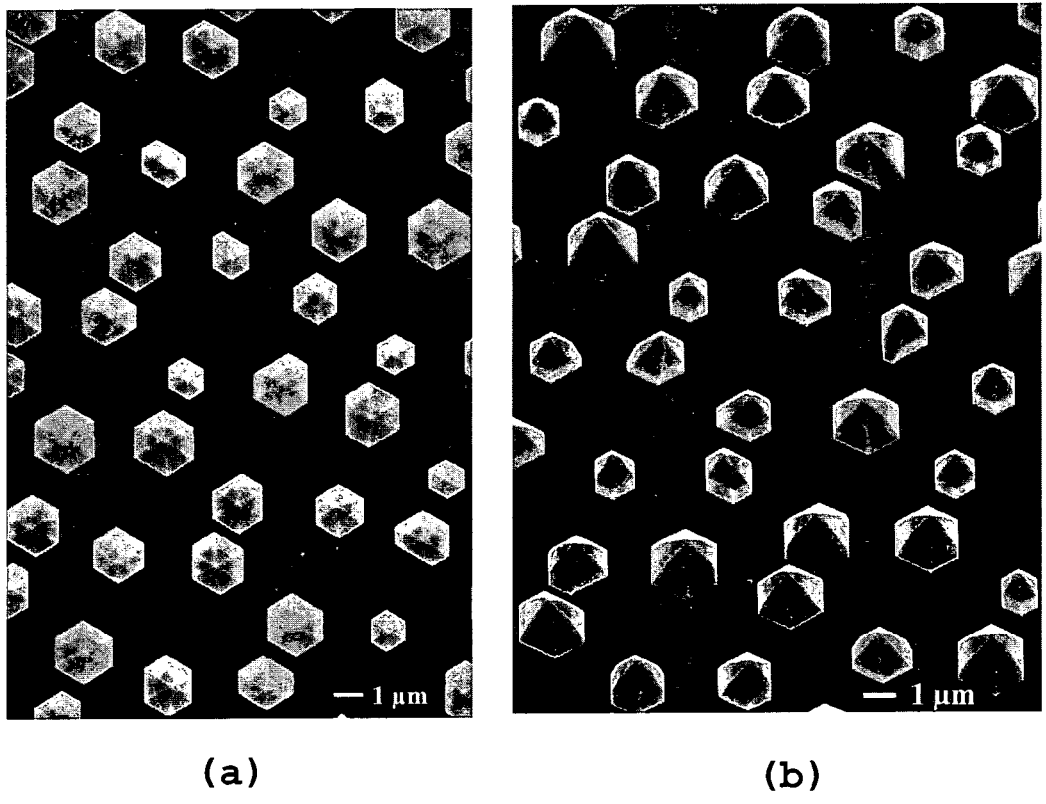
FIGS. 14a-b shows SEM images of the sample grown with a $NH_3$ flow rate of 1.0 sccm.

LED devices build on GaN nanowires are of high commercial interest due to their ability to produce light of wavelengths not accessible with other material combinations. As a further implementation example it is described how to grow GaN nanowires by selective area growth on GaN epitaxial films, sapphire, SiC or Si and even self-supporting GaN. On the starting substrate a layer of SiN$_x$ (30 nm in thickness) was deposited by PECVD. In a subsequent step, arrays of dot-patterned GaN openings (around 100 nm in diameter) were made by epitaxial beam lithography, EBL, and reactive ion etching, RIE. The pitch between the openings was ranged as 1.0~3.2 μm. Then, the as-processed samples were inserted into a, horizontal MOCVD chamber to grow GaN nanowires. The growth process comprises an initial phase wherein, temperature was ramped up to the growth zone of 1000-1500° C. within 5 min with a high NH$_3$ flow rate of 75 sccm for approx. 60 seconds giving an annealing. In a subsequent nanowire growth phase the NH$_3$ flow rate was reduced to 3.0~0.2 sccm to start the growth with introducing TMG (trimethylgallium) into the chamber. Low TMG flow rate was used through this work, between 0.12 and 1.2 μmol/min. The NH$_3$ flow rate is the crucial factor controlling the growth forms from the openings. FIG. 13 shows the SEM images of the sample grown with the NH$_3$ flow rate of 3.0 sccm. From the top-view image [FIG. 13(a)], it can be seen that the selective growth from the openings, which is the same as what was reported. The point needed to be specified here is that the lateral size after growth is larger than 1.0 μm which is much larger than the openings size of around 100 nm. Thus, the lateral growth after GaN had grown out of openings is substantial. FIG. 13(b) shows the SEM image taken by tilting the sample by 35°, which clearly presents that what were obtained are pyramids, not wires. The pyramids are delimited by six equivalent (1101) planes. The dangling bonds density of (1101) plane is 16.0/nm$^2$, which is higher than that of (1100) plane (12.1/nm$^2$) and (0001) plane (11.4/nm$^2$) [3]. From this point of view, the planes of (1100) and (0001) are expected to appear after GaN grows out of the openings. But, FIG. 13 shows the opposite. So, a possible explanation is that (1101) plane has the N-polarization, which makes it stable when NH$_3$ flow rate is high. Based on this, the flow rate of 3 sccm for NH$_3$ is actually still high for growing GaN wires faceted by (1100) plane. FIG. 14 shows the SEM characterizations of the sample grown under NH$_3$ flow rate of 1.0 sccm. The top-view image [FIG. 14(a)] is similar as FIG.

13(a). But, the 35°-tilted image [FIG. 14(b)] is different, that is vertical facets of (1100) plane begin to appear underneath the pyramids caps.

FIG. 15 shows the growth results with reducing $NH_3$ flow rate further to 0.5 sccm. Both top-view and 35°-tilted images indicate the size shrinking in lateral direction, although they are still larger than the openings size of around 100 nm. And the tilted image [FIG. 15(b)] also shows the vertical facets. As $NH_3$ flow rate was lowered to 0.2 sccm, true GaN nanowires began to be synthesized as shown in FIG. 16. In order to fabricate the GaN nanowires the $NH_3$ flow rate should be adjusted so that a low supersaturation is achived, or alternatively described; to achieve migration enhanced growth. If other shapes are required, for example pyramids, the $NH_3$ flow rate can be 1 sccm or higher. Further fabrication steps, i.e. providing cladding layers and the bulb may be performed in the above described manners.

While the invention has been described in connection with what is presently considered to be the most practical and preferred embodiments, it is to be understood that the invention is not to be limited to the disclosed embodiments, on the contrary, is intended to cover various modifications and equivalent arrangements within the appended claims.

The invention claimed is:

1. Upstanding nanostructured LED comprising a substrate and a nanowire protruding from the substrate, wherein a bulb is arranged in connection with the nanowire and at an elevated position with regards to the substrate, the bulb having a larger diameter than the nanowire, and the bulb comprising an active region to produce visible or longer wavelength light,
wherein a distance from a lower end of the bulb to the substrate is equal to or greater than a quarter of a wavelength of the light emitted by the LED.

2. LED according to claim 1, wherein the bulb is epitaxially connected to the nanowire and arranged to provide a high degree of doping for a formation of a pn-junction associated with the active region.

3. The nanostructured LED according to claim 2, wherein a reflecting structure is provided in the nanowire and the reflecting structure is a multilayered structure.

4. LED according to claim 1, wherein a distance between the active region and a surface of the bulb is in a same order of magnitude in essentially all directions.

5. LED according to claim 4, wherein the bulb is cylindrical.

6. LED according to claim 4, wherein the bulb is spherical.

7. LED according to claim 4, wherein a diameter of the bulb is about 500 nm.

8. LED according to claim 1, wherein the bulb comprises at least two layers in a shell-like structure on the nanowire and the active region is provided in one of the layers and extends radially outwards from the nanowire.

9. LED according to claim 1, wherein the elevation of the bulb with respect to the substrate is more than 30 nm.

10. LED according to claim 1, wherein the substrate is provided with a reflecting layer.

11. The nanostructured LED according to claim 10, wherein the reflecting layer is a multilayered structure.

12. The nanostructured LED according to claim 10, wherein a reflecting structure is provided by the reflective layer radially overlapping with the active region.

13. The nanostructured LED according to claim 10, wherein a reflecting structure is provided by the reflective layer extending under a part of the nanowire and covering an outer portion of the cross section of the nanowire.

14. The nanostructured LED according to claim 10, wherein the reflecting layer is provided on an opposite side of the substrate as compared to the nanowire.

15. The nanostructured LED according to claim 1, wherein a composition of the nanowire is adjusted in the direction of emitted light to raise the band gap compared to the energy of the emitted light.

16. The nanostructured LED according to claim 1, wherein the light is visible.

17. The nanostructured LED according to claim 1, wherein the bulb has bulk properties.

* * * * *